US010845610B2

(12) United States Patent
Mason

(10) Patent No.: US 10,845,610 B2
(45) Date of Patent: Nov. 24, 2020

(54) SPECTRAL FEATURE CONTROL APPARATUS

(71) Applicant: Cymer, LLC, San Diego, CA (US)

(72) Inventor: Eric Anders Mason, San Diego, CA (US)

(73) Assignee: Cymer, LLC, San Diego, CA (US)

(*) Notice: Subject to any disclaimer, the term of this patent is extended or adjusted under 35 U.S.C. 154(b) by 0 days.

(21) Appl. No.: 16/524,261

(22) Filed: Jul. 29, 2019

(65) Prior Publication Data

US 2019/0353920 A1 Nov. 21, 2019

Related U.S. Application Data

(62) Division of application No. 15/295,280, filed on Oct. 17, 2016, now Pat. No. 10,416,471.

(51) Int. Cl.
*G02B 26/00* (2006.01)
*G02B 27/14* (2006.01)
(Continued)

(52) U.S. Cl.
CPC ............ *G02B 27/4244* (2013.01); *G01J 3/06* (2013.01); *G01J 3/14* (2013.01); *G01J 3/1804* (2013.01);
(Continued)

(58) Field of Classification Search
CPC .... G02F 7/70291; G02F 7/70558; G02F 9/70; G02F 7/70633; G02F 7/70575;
(Continued)

(56) References Cited

U.S. PATENT DOCUMENTS 4,525,034 A 6/1985 Simmons
5,559,816 A 9/1996 Basting et al.
(Continued)

FOREIGN PATENT DOCUMENTS

CN 101581866 A 11/2009
DE 102009039957 A1 10/2010
(Continued)

OTHER PUBLICATIONS

Dunstan et al., "Active Spectral Control of DUV Light Sources for OPE Minimization," Optical Microlithography XIX, Proc. of SPIE, vol. 6154, Mar. 15, 2006, 9 pages.
(Continued)

*Primary Examiner* — Dawayne Pinkney
(74) *Attorney, Agent, or Firm* — DiBerardino McGovern IP Group LLC

(57) ABSTRACT

A spectral feature selection apparatus includes a dispersive optical element arranged to interact with a pulsed light beam; three or more refractive optical elements arranged in a path of the pulsed light beam between the dispersive optical element and a pulsed optical source; and one or more actuation systems, each actuation system associated with a refractive optical element and configured to rotate the associated refractive optical element to thereby adjust a spectral feature of the pulsed light beam. At least one of the actuation systems is a rapid actuation system that includes a rapid actuator configured to rotate its associated refractive optical element about a rotation axis. The rapid actuator includes a rotary stepper motor having a rotation shaft that rotates about a shaft axis that is parallel with the rotation axis of the associated refractive optical element.

17 Claims, 10 Drawing Sheets

(51) Int. Cl.
*G02B 27/12* (2006.01)
*G02B 5/04* (2006.01)
*G02B 27/42* (2006.01)
*G01J 3/06* (2006.01)
*G01J 3/14* (2006.01)
*G01J 3/18* (2006.01)
*G03F 7/20* (2006.01)
*H01S 3/08* (2006.01)
*H01L 21/027* (2006.01)
*H01S 3/00* (2006.01)
*H01S 3/23* (2006.01)
*G01J 3/12* (2006.01)
*H01S 3/225* (2006.01)

(52) U.S. Cl.
CPC ....... G02B 26/007 (2013.01); G03F 7/70575 (2013.01); H01L 21/0275 (2013.01); H01S 3/0085 (2013.01); H01S 3/08004 (2013.01); H01S 3/2308 (2013.01); *G01J 2003/061* (2013.01); *G01J 2003/063* (2013.01); *G01J 2003/064* (2013.01); *G01J 2003/069* (2013.01); *G01J 2003/1208* (2013.01); *H01S 3/08009* (2013.01); *H01S 3/225* (2013.01); *H01S 3/2366* (2013.01)

(58) Field of Classification Search
CPC .............. G02F 7/7085; G02F 7/70141; G02F 7/70358; G02F 1/293; G01B 11/27; G01J 3/46; G02B 26/001; G02B 27/145; G02B 27/0961; G02B 26/0841; G02B 27/144; G02B 27/1013; G02B 27/126; G02B 5/04; G03B 27/02; G03B 27/80; G03B 27/68; B60R 1/06
USPC ........ 359/237–238, 618, 299, 624, 290–292, 359/872, 496, 629, 638–640, 831; 355/52–53, 67–71; 356/399–402
See application file for complete search history.

(56) References Cited

U.S. PATENT DOCUMENTS

| | | | |
|---|---|---|---|
| 5,661,547 A | 8/1997 | Aketagawa et al. | |
| 5,978,409 A * | 11/1999 | Das | G03F 7/70025 372/100 |
| 6,061,382 A | 5/2000 | Govorkov et al. | |
| 6,356,576 B1 | 3/2002 | Smith | |
| 6,393,037 B1 | 5/2002 | Basting et al. | |
| 6,526,086 B1 | 2/2003 | Wakabayashi et al. | |
| 6,567,450 B2 | 5/2003 | Myers et al. | |
| 6,614,828 B1 | 9/2003 | Basting et al. | |
| 6,671,294 B2 | 12/2003 | Kroyan et al. | |
| 6,738,410 B2 | 5/2004 | Partlo et al. | |
| 6,853,653 B2 | 2/2005 | Spangler et al. | |
| 6,985,508 B2 | 1/2006 | Knowles et al. | |
| 7,154,928 B2 | 12/2006 | Sandstrom et al. | |
| 7,203,216 B2 | 4/2007 | Ershov et al. | |
| 7,366,219 B2 | 4/2008 | Algots et al. | |
| 7,382,815 B2 | 6/2008 | Spangler et al. | |
| 7,782,922 B2 | 8/2010 | Hori et al. | |
| 7,822,084 B2 | 10/2010 | O'Brien et al. | |
| 7,885,309 B2 * | 2/2011 | Ershov | H01S 3/225 372/57 |
| 7,899,095 B2 | 3/2011 | Partlo | |
| 8,126,027 B2 | 2/2012 | Algots et al. | |
| 8,144,739 B2 | 3/2012 | Figueroa et al. | |
| 9,835,959 B1 | 12/2017 | Conley et al. | |
| 9,989,866 B2 | 6/2018 | Mason et al. | |
| 9,997,888 B2 | 6/2018 | Conley et al. | |
| 2002/0012374 A1 | 1/2002 | Basting et al. | |
| 2002/0047992 A1 | 4/2002 | Graves et al. | |
| 2002/0141464 A1 | 10/2002 | Bushida et al. | |
| 2002/0141471 A1 | 10/2002 | Aab et al. | |
| 2005/0092905 A1 | 5/2005 | Kawai et al. | |
| 2007/0104231 A1 | 5/2007 | Schwarz | |
| 2007/0297467 A1 | 12/2007 | Fomenkov et al. | |
| 2008/0232408 A1 | 9/2008 | O'Brien et al. | |
| 2008/0253408 A1 | 10/2008 | Ishihara | |
| 2008/0253413 A1 | 10/2008 | Partlo | |
| 2008/0285602 A1 | 11/2008 | Nagai et al. | |
| 2011/0122901 A1 | 5/2011 | Sandstrom et al. | |
| 2012/0248578 A1 | 10/2012 | Masuda | |
| 2013/0064258 A1 | 3/2013 | Fujimoto et al. | |
| 2013/0107899 A1 | 5/2013 | Matsunaga et al. | |
| 2013/0230064 A1 | 9/2013 | Tanaka et al. | |
| 2013/0315270 A1 | 11/2013 | Kumazaki et al. | |
| 2014/0104614 A1 * | 4/2014 | Rokitski | G01J 3/1809 356/402 |
| 2015/0070673 A1 | 3/2015 | Lalovic et al. | |
| 2015/0185485 A1 | 7/2015 | Li et al. | |
| 2015/0380893 A1 * | 12/2015 | Matsunaga | H01S 3/104 372/20 |
| 2017/0179677 A1 | 6/2017 | Thornes et al. | |
| 2019/0181607 A1 * | 6/2019 | Miyamoto | H01S 3/0812 |

FOREIGN PATENT DOCUMENTS

| | | |
|---|---|---|
| JP | H02276283 A | 11/1990 |
| JP | H05152666 A | 6/1993 |
| JP | 2001264688 A | 9/2001 |
| JP | 2003031881 A | 1/2003 |
| JP | 2003051634 A | 2/2003 |
| JP | 2003521129 A | 7/2003 |
| JP | 2008098282 A | 4/2008 |
| JP | 2008522439 A | 6/2008 |
| JP | 2010243241 A | 10/2010 |
| JP | 2011134828 A | 7/2011 |
| JP | 2011249832 A | 12/2011 |
| JP | 2013070029 A | 4/2013 |
| JP | 2013098239 A | 5/2013 |
| JP | 2013179247 A | 9/2013 |
| JP | 2013247240 A | 12/2013 |
| JP | 2014170961 A | 9/2014 |
| JP | 2016526697 A | 9/2016 |
| KR | 20120057249 A | 6/2012 |
| WO | 2011077661 A1 | 6/2011 |
| WO | 2015187854 A1 | 12/2015 |

OTHER PUBLICATIONS

Jacques et al., "Active Spectral-Control Techniques for Improving OPC," Solid State Technology, Dec. 2006, vol. 49, No. 12, 5 pages.
Blaine R. Copenheaver, U.S. International Searching Authority, International Search Report and Written Opinion, counterpart PCT Application No. PCT/US2017/055161, dated Jan. 25, 2018, 13 pages total.
Office Action, counterpart Taiwanese Patent Application No. 106135282, dated Jun. 7, 2018, 15 pages total (including English translation of 7 pages).
Decision, counterpart Taiwanese Patent Application No. 106135282, dated Sep. 13, 2018, 8 pages total (including English translation of 3 pages).
Office Action, counterpart Taiwanese Patent Application No. 108105848 dated Oct. 24, 2019, 11 pages total (including English translation of 5 pages).
Office Action, counterpart Japanese Patent Application No. 2019-513789, dated Mar. 16, 2020, 13 pages total (including English translation of 7 pages).
Office Action, counterpart Korean Patent Application No. 10-2019-7013727, dated Jun. 18, 2020, 12 pages total (including English translation of 6 pages).

* cited by examiner

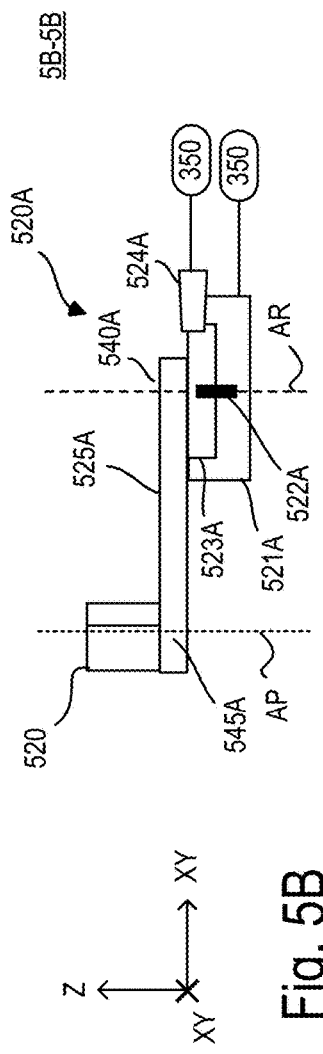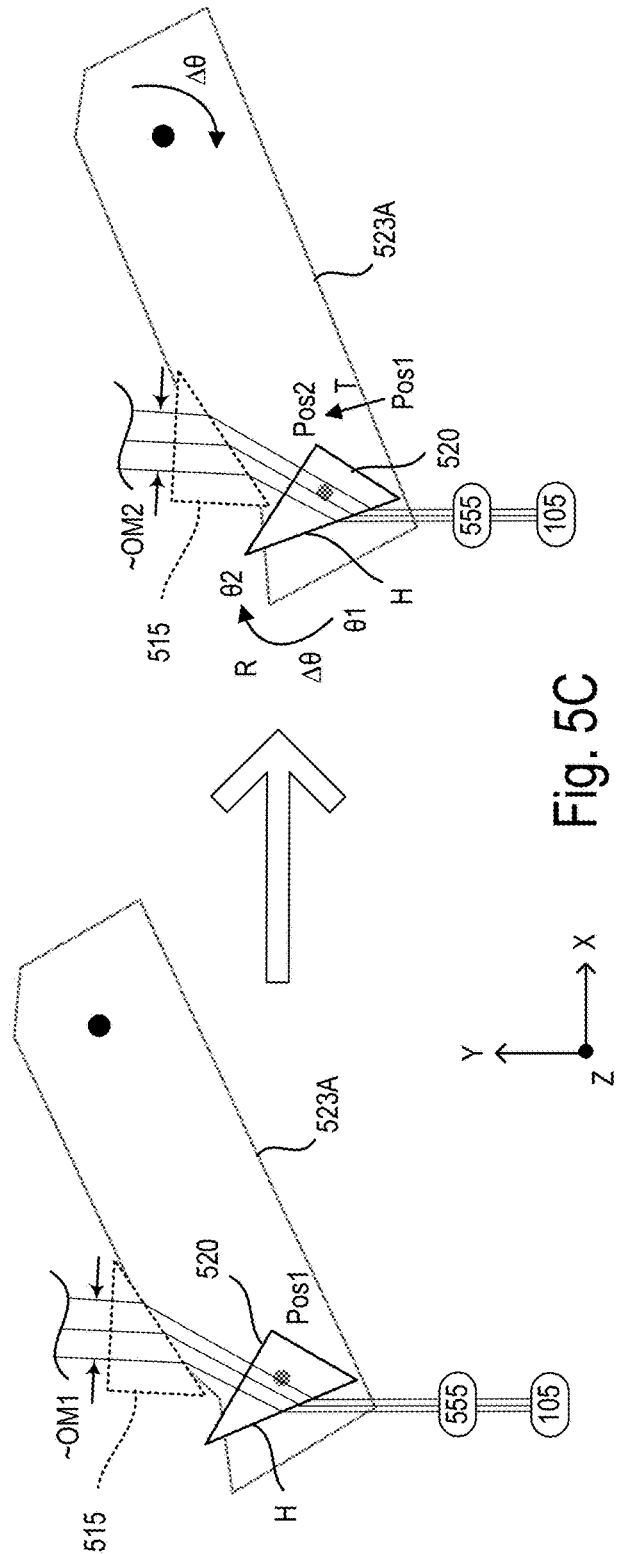
Fig. 5B
Fig. 5C

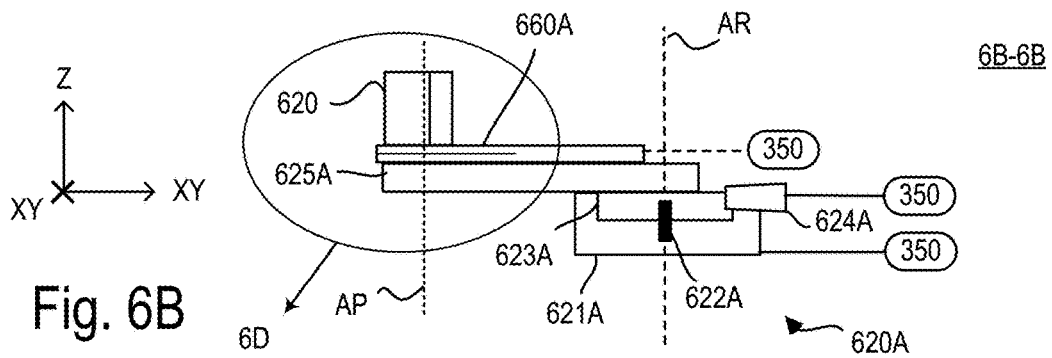
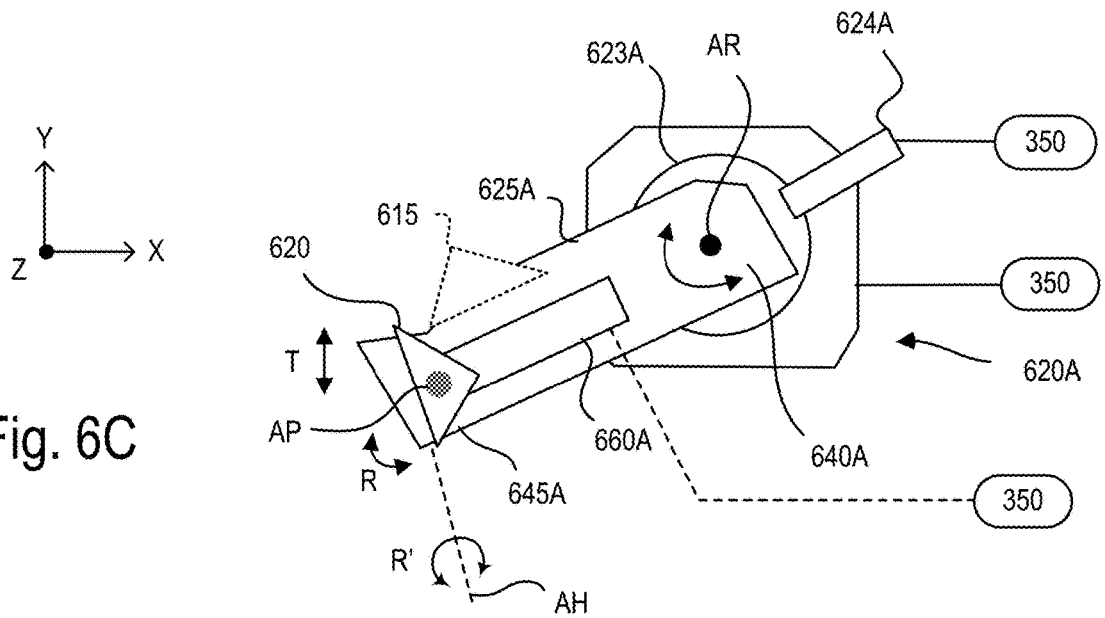
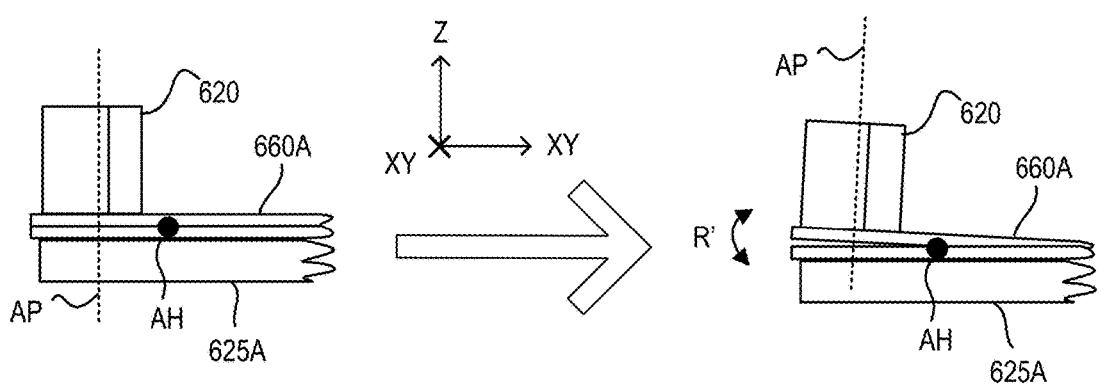
Fig. 6B
Fig. 6C
Fig. 6D

SPECTRAL FEATURE CONTROL APPARATUS

CROSS REFERENCE TO RELATED APPLICATION

This application is a divisional of U.S. application Ser. No. 15/295,280, filed Oct. 17, 2016, now U.S. Pat. No. 10,416,471, issued Sep. 17, 2019, and titled "SPECTRAL FEATURE CONTROL APPARATUS," which is incorporated herein by reference in its entirety.

TECHNICAL FIELD

The disclosed subject matter relates to an apparatus for controlling a spectral feature, such as, for example, bandwidth or wavelength, of a light beam output from an optical source that supplies light to a lithography exposure apparatus.

BACKGROUND

In semiconductor lithography (or photolithography), the fabrication of an integrated circuit (IC) requires a variety of physical and chemical processes performed on a semiconductor (for example, silicon) substrate (which is also referred to as a wafer). A photolithography exposure apparatus or scanner is a machine that applies a desired pattern onto a target portion of the substrate. The wafer is fixed to a stage so that the wafer generally extends along a plane defined by orthogonal $X_L$ and $Y_L$ directions of the scanner. The wafer is irradiated by a light beam, which has a wavelength in the deep ultraviolet (DUV) range. The light beam travels along an axial direction, which corresponds with the $Z_L$ direction of the scanner. The $Z_L$ direction of the scanner is orthogonal to the lateral $X_L$-$Y_L$ plane.

An accurate knowledge of spectral features or properties (for example, a bandwidth) of a light beam output from an optical source such as a laser is important in many scientific and industrial applications. For example, accurate knowledge of the optical source bandwidth is used to enable control of a minimum feature size or critical dimension (CD) in deep ultraviolet (DUV) optical lithography. The critical dimension is the feature size that is printed on a semiconductor substrate (also referred to as a wafer) and therefore the CD can require fine size control. In optical lithography, the substrate is irradiated by a light beam produced by an optical source. Often, the optical source is a laser source and the light beam is a laser beam.

SUMMARY

In some general aspects, an optical system is used with a light source. The optical system includes a dispersive optical element; a plurality of refractive optical elements between the dispersive optical element and light source; and actuation systems, each actuation system associated with a refractive optical element. At least one of the actuation systems includes an actuator configured to rotate the associated refractive optical element 360 degrees about a rotation axis, the actuator comprising a rotation shaft configured to rotate about a shaft axis, the shaft axis being parallel with the rotation axis of the associated refractive optical element and the shaft axis lacking a ground energy state.

In some general aspects, a spectral feature selection apparatus is used with a pulsed optical source that produces a pulsed light beam. The spectral feature selection apparatus includes a dispersive optical element arranged to interact with the pulsed light beam; three or more refractive optical elements arranged in a path of the pulsed light beam between the dispersive optical element and the pulsed optical source; one or more actuation systems, each actuation system associated with a refractive optical element and configured to rotate the associated refractive optical element to thereby adjust a spectral feature of the pulsed light beam; and a control system connected to the one or more actuation systems. At least one of the actuation systems is a rapid actuation system that includes a rapid actuator configured to rotate its associated refractive optical element about a rotation axis. The rapid actuator includes a rotary stepper motor having a rotation shaft that rotates about a shaft axis that is parallel with the rotation axis of the associated refractive optical element. The control system is configured to send a signal to the rapid actuator to adjust the rotation shaft of the rotary stepper motor to thereby rotate the associated refractive optical element about its rotation axis.

Implementations can include one or more of the following features. For example, the rapid actuator can be configured to rotate the refractive optical element that is farthest from the dispersive optical element. The pulsed light beam path can lie in an XY plane of the apparatus, and the rotation shaft of the rotary stepper motor can have an axis that is parallel with a Z axis of the apparatus to thereby rotate the associated refractive optical element about its rotation axis, which is parallel with the Z axis of the apparatus.

The rapid actuation system can also include a secondary actuator physically coupled to the associated refractive optical element, the secondary actuator configured to rotate the associated refractive optical element about an axis that lies in the XY plane and also lies in the plane of a hypotenuse of the associated refractive optical element.

The apparatus can include a position monitor that detects a position of the rotation shaft of the rotary stepper motor. The control system can be connected to the position monitor, and can be configured to receive the detected position of the rotation shaft and to adjust the rotation shaft if the received detected position is not within an acceptable range of positions. The position monitor can be an optical rotary encoder. The rotation shaft can be configured to rotate the refractive optical element associated with the rapid actuator about an offset axis that is offset from the rotation axis.

The shaft axis can be configured to rotate about 360° to thereby rotate the associated refractive optical element about 360°.

The refractive optical element associated with the rapid actuator can be fixedly coupled to the shaft axis.

The control system can include a rapid controller connected to the rotary stepper motor, the adjustment to the rotation shaft being performed by way of the rapid controller.

The rotation of the refractive optical element associated with the rapid actuator can cause a change in the magnification of the pulsed light beam that interacts with the dispersive optical element. The change in magnification of the pulsed light beam can cause a change in the bandwidth of the pulsed light beam. The range of bandwidth due to the rotation of the refractive optical element associated with the rapid actuator can be at least 250 femtometers (fm). The rotation of the refractive optical element associated with the rapid actuator by one unit of rotation of the rotation shaft can cause the bandwidth of the pulsed light beam to change by an amount that is less than a resolution of a bandwidth measurement device that measures the bandwidth of the pulsed light beam.

The dispersive optical element can be a diffractive optical element arranged to interact with a pulsed light beam in a Littrow configuration so that the pulsed light beam diffracted from the diffractive optical element travels along the path of the pulsed light beam that is incident on the diffractive optical element.

The refractive optical elements can be right-angled prisms through which the pulsed light beam is transmitted so that the pulsed light beam changes its optical magnification as it passes through each right-angled prism. The right-angled prism that is farthest from the dispersive optical element can have the smallest hypotenuse of the plurality, and each consecutive right-angled prism closer to the dispersive optical element can have a larger or same size hypotenuse than the adjacent right-angled prism that is farther from the dispersive optical element.

In other general aspects, a spectral feature selection apparatus includes a dispersive optical element arranged to interact with a pulsed light beam produced by a pulsed optical source. The spectral feature selection apparatus includes a plurality of refractive optical elements arranged in a path of the pulsed light beam between the dispersive optical element and the pulsed optical source; and a plurality of actuation systems. Each actuation system is associated with a refractive optical element and is configured to rotate the associated refractive optical element to thereby adjust a spectral feature of the pulsed light beam. At least one of the actuation systems includes a rapid actuator that includes a rotary motor having a rotational shaft that rotates about a shaft axis that is perpendicular to a plane of the apparatus. The refractive optical element associated with the rapid actuator is mounted to the rapid actuator so that the refractive optical element is rotated about an offset axis that is parallel with the shaft axis, is offset from its center of gravity, and is offset from the shaft axis.

Implementations can include one or more of the following features. For example, the rapid actuator can cause the associated refractive optical element to both rotate about the offset axis and linearly translate. The rapid actuator can include a lever arm that includes: a first region that is mechanically linked to the rotational shaft at the location of the shaft axis, and a second region that is offset from the shaft axis along a direction perpendicular to the shaft axis and lying in the plane of the apparatus so that the second region is not intersected by the shaft axis. The refractive optical element associated with the rapid actuator is mechanically linked to the second region.

The apparatus can also include a control system connected to the plurality of actuation systems and configured to send a signal to each actuation system. The control system can be configured to send a signal to the rapid actuator to thereby rotate and translate the refractive optical element associated with the rapid actuator to adjust a spectral feature of the pulsed light beam. The refractive optical element associated with the rapid actuator can be configured to be rotated about the offset axis by 15 degrees and come to a stable equilibrium position in less than or equal to about 50 milliseconds.

The spectral feature can be one or more of a bandwidth and a wavelength of the pulsed light beam. The refractive optical element controlled by the rapid actuator can lack an anti-reflection coating.

In other general aspects, a spectral feature selection apparatus includes a diffractive optical element arranged to interact with a pulsed light beam in a Littrow configuration, the pulsed light beam being produced by an optical source. The spectral feature selection apparatus also includes a set of four or more right-angled prisms through which the pulsed light beam is transmitted so that the pulsed light beam changes its optical magnification as it passes through each right-angled prism. The pulsed light beam travels along a beam path and has a transverse extent that crosses the hypotenuse of each prism so that the transverse extent of the pulsed light beam is contained within each of the hypotenuses of each prism. The right-angled prism that is closest to the diffractive optical element has a hypotenuse having the largest length of the set. Each consecutive right-angled prism farther from the diffractive optical element has a hypotenuse having a length that is smaller than or equal to the hypotenuse of the adjacent right-angled prism that is closer to the diffractive optical element. The right-angled prism that is closest to the diffractive optical element is arranged with its right angle positioned away from the diffractive optical element. The region between the right-angled prism that is farthest from the diffractive optical element and the diffractive optical element is void of any reflective optical element. The spectral feature selection apparatus also includes at least two actuation systems, each actuation system associated with a right-angled prism of the set and configured to rotate the associated right-angled prism relative to the pulsed light beam to thereby adjust a spectral feature of the pulsed light beam.

Implementations can include one or more of the following features. For example, the prism that is farthest from the diffractive optical element can be associated with an actuation system and can be movable, and the prism that is the second closest to the diffractive optical element can be associated with an actuation system and can be movable.

DESCRIPTION OF DRAWINGS

FIG. 5B is a side view of a portion of an exemplary beam expander of the spectral feature selection apparatus of FIG. 5A;

FIG. 5C is a top view of a portion of the exemplary beam expander of FIG. 5B showing an adjustment to the beam expander;

FIG. 6B is a side view of a portion of an exemplary beam expander of the spectral feature selection apparatus of FIG. 6A;

FIG. 6C is a top view of a portion of the exemplary beam expander of FIG. 6A;

FIG. 6D is a side view of a portion of the exemplary beam expander of FIG. 6B showing an adjustment to the beam expander;

DESCRIPTION

Figure 1:
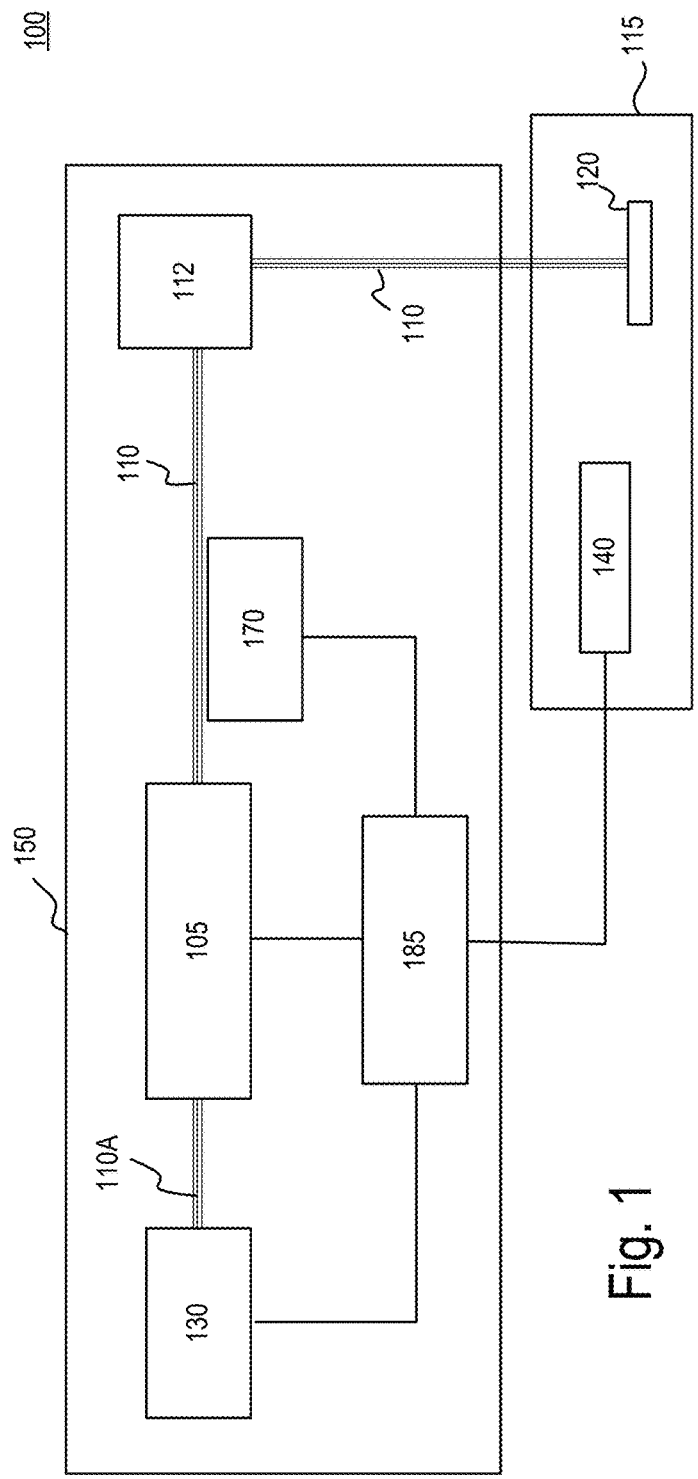
FIG. 1 is a block diagram of a photolithography system producing a pulsed light beam, the photolithography system including a spectral feature selection apparatus for tuning one or more spectral features of the pulsed light beam.

Referring to FIG. 1, a photolithography system 100 includes an illumination system 150 that produces a pulsed light beam 110 having a wavelength that is nominally at a center wavelength and is directed to a photolithography exposure apparatus or scanner 115. The pulsed light beam 110 is used to pattern microelectronic features on a substrate or wafer 120 received in the scanner 115. The illumination system 150 includes an optical source 105 that produces the pulsed light beam 110 at a pulse repetition rate that is capable of being changed. The illumination system 150 includes a control system 185 that communicates with the optical source 105 and other features within the illumination system 150. The illumination system 150 also communicates with the scanner 115 to control the operation of the illumination system 150 and aspects of the pulsed light beam 110.

The light beam 110 is directed through a beam preparation system 112, which can include optical elements that modify aspects of the light beam 110. For example, the beam preparation system 112 can include reflective and/or refractive optical elements, optical pulse stretchers, and optical apertures (including automated shutters).

Figure 2:
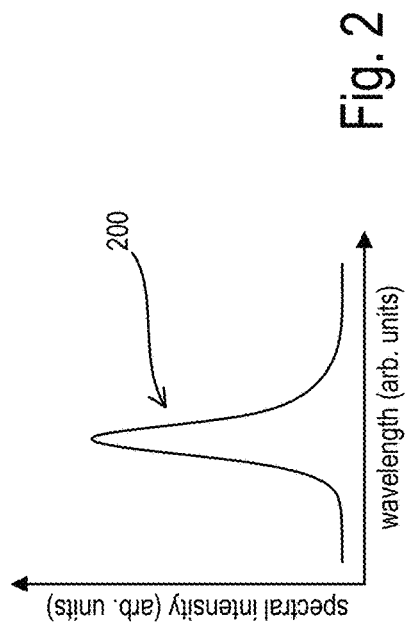
FIG. 2 is a graph of an exemplary optical spectrum of the pulsed light beam produced by the photolithography system of FIG. 1.

The pulses of the light beam 110 are centered around a wavelength that is in the deep ultraviolet (DUV) range, for example, with wavelengths of 248 nanometers (nm) or 193 nm. The size of the microelectronic features patterned on the wafer 120 depends on the wavelength of the pulsed light beam 110, with a lower wavelength resulting in a small minimum feature size or critical dimension. When the wavelength of the pulsed light beam 110 is 248 nm or 193 nm, the minimum size of the microelectronic features can be, for example, 50 nm or less. The bandwidth that is used for analysis and control of the pulsed light beam 110 can be the actual, instantaneous bandwidth of its optical spectrum 200 (or emission spectrum), as shown in FIG. 2. The optical spectrum 200 contains information about how the optical energy or power of the light beam 110 is distributed over different wavelengths (or frequencies).

The illumination system 150 includes a spectral feature selection apparatus 130. The spectral feature selection apparatus 130 is placed at a first end of the optical source 105 to interact with a light beam 110A produced by the optical source 105. The light beam 110A is a beam produced at one end of the resonators within the optical source 105 and can be a seed beam produced by a master oscillator, as discussed below. The spectral feature selection apparatus 130 is configured to finely tune the spectral properties of the pulsed light beam 110 by tuning or adjusting one or more spectral features (such as the bandwidth or wavelength) of the pulsed light beam 110A.

Figure 3A:
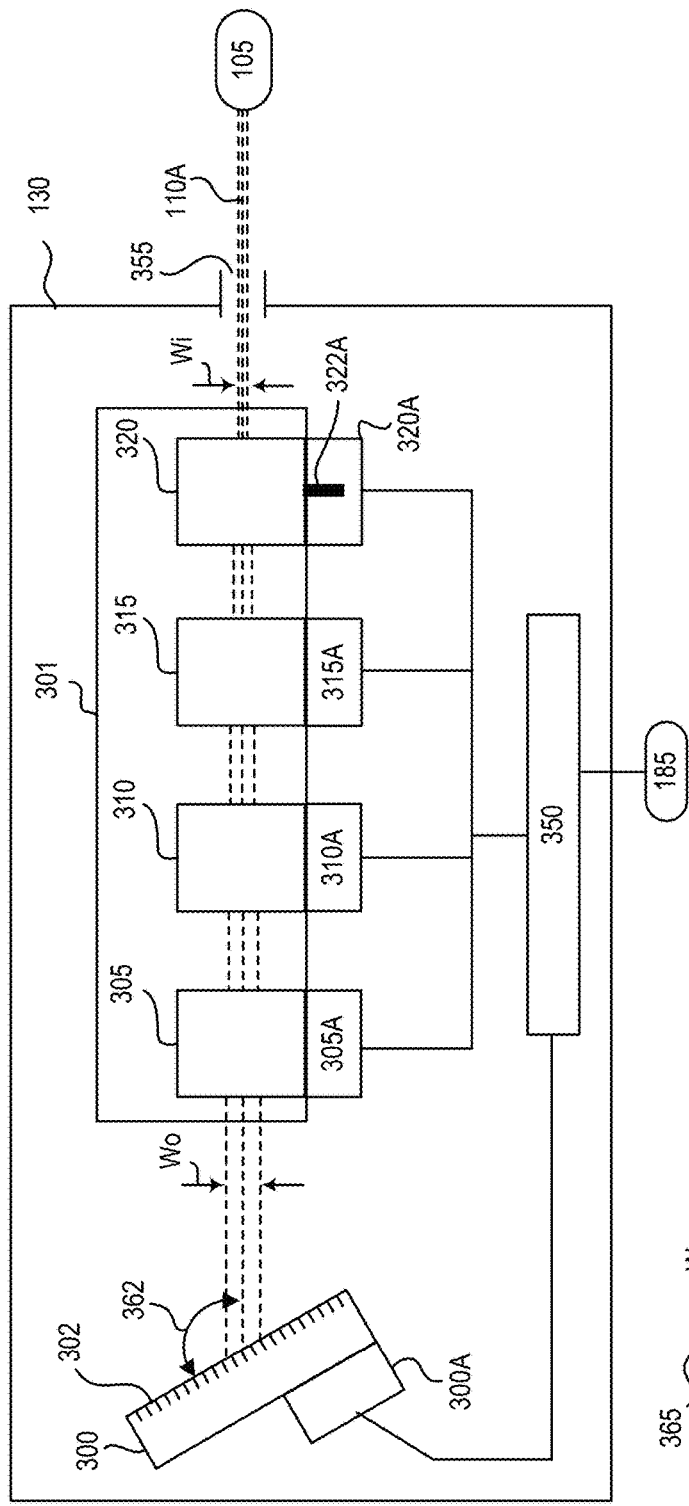
FIGS. 3A, 4A, 5A, 6A, and 7 are block diagrams of exemplary spectral feature selection apparatuses that can be used in the photolithography system of FIG. 1.

Referring to FIG. 3A, the spectral feature selection apparatus 130 includes a set of optical features or components 300, 305, 310, 315, 320 arranged to optically interact with the pulsed light beam 110A and a control module 350 that includes electronics in the form of any combination of firmware and software. The control module 350 is connected to one or more actuation systems 300A, 305A, 310A, 315A, 320A physically coupled to respective optical components 300, 305, 310, 315, 320. The optical components of the apparatus 130 include a dispersive optical element 300, which can be a grating, and a beam expander 301 made of a set of refractive optical elements 305, 310, 315, 320, which can be prisms. The grating 300 can be a reflective grating that is designed to disperse and reflect the light beam 110A; accordingly, the grating 300 is made of a material that is suitable for interacting with a pulsed light beam 110A having a wavelength in the DUV range. Each of the prisms 305, 310, 315, 320 is a transmissive prism that acts to disperse and redirect the light beam 110A as it passes through the body of the prism. Each of the prisms can be made of a material (such as, for example, calcium fluoride) that permits the transmission of the wavelength of the light beam 110A.

The prism 320 is positioned farthest from the grating 300 while the prism 305 is positioned closest to the grating 300. The pulsed light beam 110A enters the apparatus 130 through an aperture 355, and then travels through the prism 320, the prism 310, and the prism 305, in that order, prior to impinging upon a diffractive surface 302 of the grating 300. With each passing of the beam 110A through a consecutive prism 320, 315, 310, 305, the light beam 110A is optically magnified and redirected (refracted at an angle) toward the next optical component. The light beam 110A is diffracted and reflected from the grating 300 back through the prism 305, the prism 310, the prism 315, and the prism 320, in that order, prior to passing through the aperture 355 as the light beam 110A exits the apparatus 130. With each passing through the consecutive prisms 305, 310, 315, 320 from the grating 300, the light beam 110A is optically compressed as it travels toward the aperture 355.

Figure 3B:
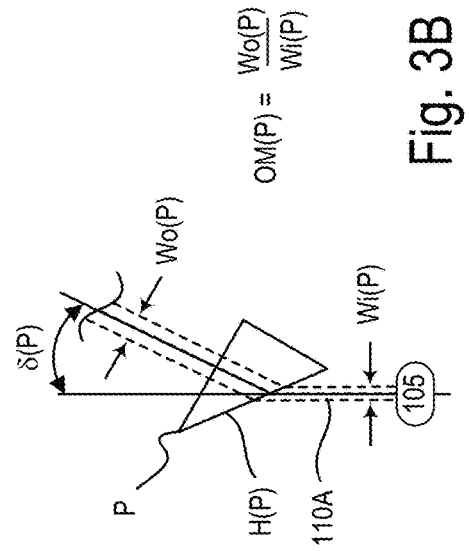
FIG. 3B is a block diagram showing a beam magnification and a beam refraction angle through one of the refractive optical elements of the spectral feature selection apparatus of FIG. 3A.

Referring to FIG. 3B, the rotation of a prism P (which can be any one of prisms 305, 310, 315, or 320) of the beam expander 301 changes an angle of incidence at which the light beam 110A impinges upon the entrance surface H(P) of that rotated prism P. Moreover, two local optical qualities, namely, an optical magnification OM(P) and a beam refraction angle δ(P), of the light beam 110A through that rotated prism P are functions of the angle of incidence of the light beam 110A impinging upon the entrance surface H(P) of that rotated prism P. The optical magnification OM(P) of the light beam 110A through the prism P is the ratio of a transverse wide Wo(P) of the light beam 110A exiting that prism P to a transverse width Wi(P) of the light beam 110A entering that prism P.

A change in the local optical magnification OM(P) of the light beam 110A at one or more of the prisms P within the beam expander 301 causes an overall change in the optical magnification OM 365 of the light beam 110A through the beam expander 301. The optical magnification OM 365 of the light beam 110A through the beam expander 301 is the ratio of the transverse width Wo of the light beam 110A exiting the beam expander 301 to a transverse width Wi of the light beam 110A entering the beam expander 301.

Additionally, a change in the local beam refraction angle δ(P) through one or more of the prisms P within the beam expander 301 causes an overall change in an angle of incidence of 362 of the light beam 110A at the surface 302 of the grating 300.

The wavelength of the light beam 110A can be adjusted by changing the angle of incidence 362 at which the light beam 110A impinges upon the diffractive surface 302 of the grating 300. The bandwidth of the light beam 110A can be adjusted by changing the optical magnification 365 of the light beam 110.

As discussed herein, for example, with respect to FIGS. 3A-7, the spectral feature selection apparatus 130 is redesigned to provide for more rapid adjustment of the bandwidth of the pulsed light beam 110 while the light beam 110 is being scanned across the wafer 120 by the scanner 115. The spectral feature selection apparatus 130 can be redesigned with one or more new actuation systems for more effectively and more rapidly rotating one or more of the optical components 300, 305, 310, 315, 320.

For example, the spectral feature selection apparatus 130 includes a new actuation system 320A for more effectively and more rapidly rotating the prism 320. The new actuation system 320A can be designed in a manner that increases the speed with which the prism 320 is rotated. Specifically, the axis of rotation of the prism 320 mounted to the new actuation system 320A is parallel with a rotatable motor shaft 322A of the new actuation system 320A. In other implementations, the new actuation system 320A can be designed to include an arm that is physically linked to the motor shaft 322A at one end and physically linked to the prism 320 at the other end to provide additional leverage for rotating the prism 320. In this way, the optical magnification OM of the light beam 110A is made to be more sensitive to rotation of the prism 320.

Figure 7:
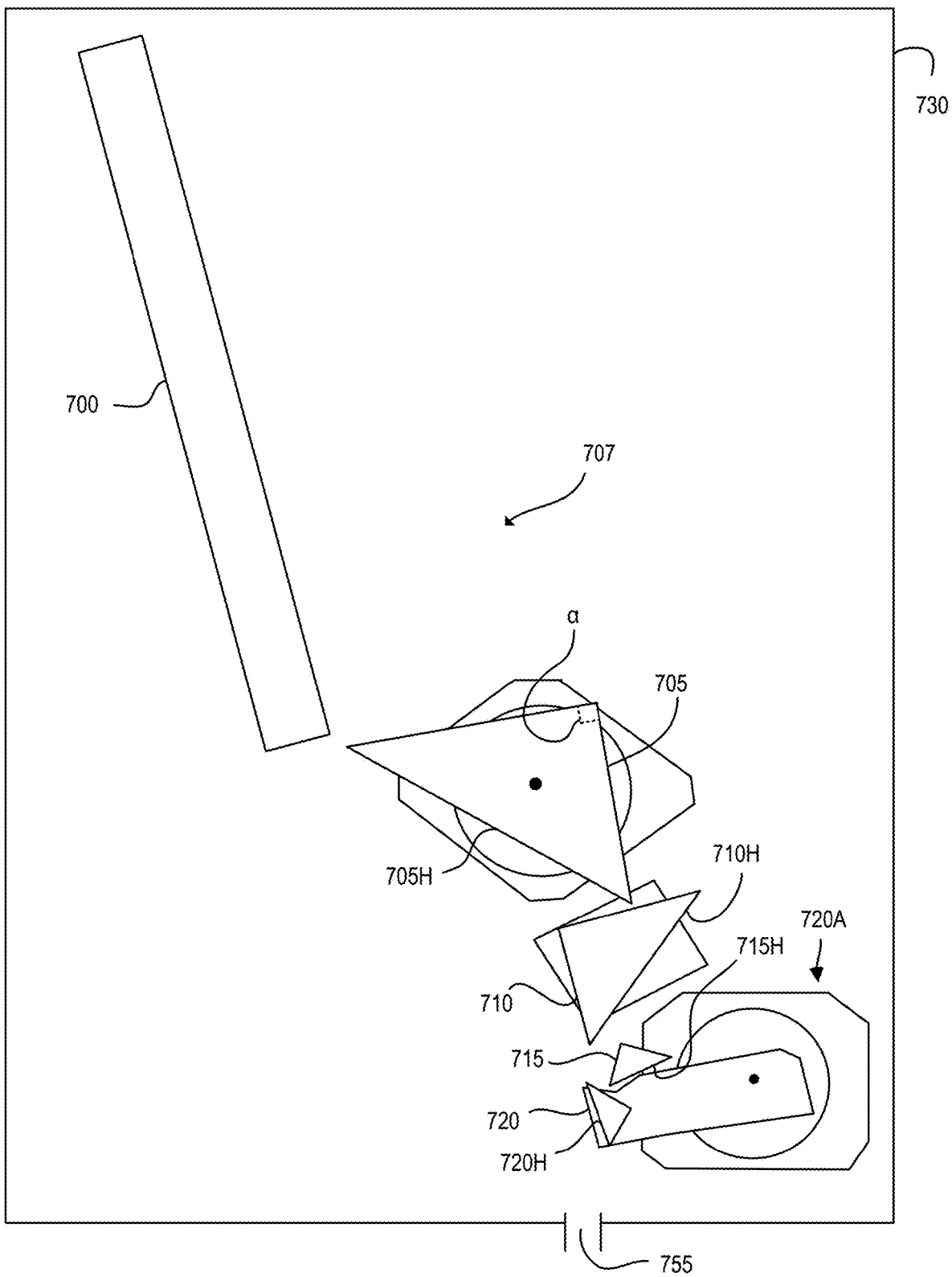

In some implementations, such as shown in FIG. 7, the prism 305 is flipped relative to the prior design of the beam expander to provide for more rapid adjustment of the bandwidth. In these cases, the bandwidth change becomes relatively faster (when compared with prior designs of the apparatus 130) with a relatively smaller rotation of the prism 320. The change in optical magnification per unit rotation of the prism 320 is increased in the redesigned spectral feature selection apparatus 130 when compared with prior spectral feature selection apparatuses.

The apparatus 130 is designed to adjust the wavelength of the light beam 110A that is produced within the resonator or resonators of the optical source 105 by adjusting an angle 362 of incidence of at which the light beam 110A impinges upon the diffractive surface 302 of the grating 300. Specifically, this can be done by rotating one or more of the prisms 305, 310, 315, 320 and the grating 300 to thereby adjust the angle of incidence 362 of the light beam 110A.

Moreover, the bandwidth of the light beam 110A that is produced by the optical source 105 is adjusted by adjusting the optical magnification OM 365 of the light beam 110A. Thus, the bandwidth of the light beam 110A can be adjusted by rotating one or more of the prisms 305, 310, 315, 320, which causes the optical magnification 365 of the light beam 110A to change.

Because the rotation of a particular prism P causes a change in both the local beam refraction angle δ(P) and the local optical magnification OM(P) at that prism P, the control of wavelength and bandwidth are coupled in this design.

Additionally, the bandwidth of the light beam 110A is relatively sensitive to the rotation of the prism 320 and relatively insensitive to rotation of the prism 305. This is because any change in the local optical magnification OM(320) of the light beam 110A due to the rotation of the prism 320 is multiplied by the product of the change in the optical magnification OM(315), OM(310), OM(305), respectively, in the other prisms 315, 310, and 305 because those prisms are between the rotated prism 320 and the grating 300, and the light beam 110A must travel through these other prisms 315, 310, 305 after passing through the prism 320. On the other hand, the wavelength of the light beam 110A is relatively sensitive to the rotation of the prism 305 and relatively insensitive to the rotation of the prism 320.

For example, in order to change the wavelength without changing the bandwidth of the light beam 110A, the angle of incidence 362 should be changed without changing the optical magnification 365. This can be achieved by rotating the prism 305 by a large amount and rotating the prism 320 by a small amount. In order to change the bandwidth without changing the wavelength, the optical magnification 365 should be changed without changing the angle of incidence 362, and this can be achieved by rotating the prism 320 by a large amount and rotating the prism 305 by a small amount.

The control module 350 is connected to one or more actuation systems 300A, 305A, 310A, 315A, 320A that are physically coupled to respective optical components 300, 305, 310, 315, 320. Although an actuation system is shown for each of the optical components it is possible that some of the optical components in the apparatus 130 are either kept stationary or are not physically coupled to an actuation system. For example, in some implementations, the grating 300 can be kept stationary and the prism 315 can be kept stationary and not physically coupled to an actuation system.

Each of the actuation systems 300A, 305A, 310A, 315A, 320A includes an actuator that is connected to its respective optical components. The adjustment of the optical components causes the adjustment in the particular spectral features (the wavelength and/or bandwidth) of the light beam 110A. The control module 350 receives a control signal from the control system 185, the control signal including specific commands to operate or control one or more of the actuation systems. The actuation systems can be selected and designed to work cooperatively.

Each of the actuators of the actuation systems 300A, 305A, 310A, 315A, 320A is a mechanical device for moving or controlling the respective optical component. The actuators receive energy from the module 350, and convert that energy into some kind of motion imparted to the respective optical component. For example, the actuation systems can be any one of force devices and rotation stages for rotating one or more of prisms of a beam expander. The actuation systems can include, for example, motors such as stepper motors, valves, pressure-controlled devices, piezoelectric devices, linear motors, hydraulic actuators, voice coils, etc.

The grating 300 can be a high blaze angle Echelle grating, and the light beam 110A incident on the grating 300 at any angle of incidence 362 that satisfies a grating equation will be reflected (diffracted). The grating equation provides the relationship between the spectral order of the grating 300, the diffracted wavelength (the wavelength of the diffracted beam), the angle of incidence 362 of the light beam 110A onto the grating 300, the angle of exit of the light beam 110A diffracted off the grating 300, the vertical divergence of the light beam 110A incident onto the grating 300, and the groove spacing of the diffractive surface of the grating 300. Moreover, if the grating 300 is used such that the angle of incidence 362 of the light beam 110A onto the grating 300 is equal to the angle of exit of the light beam 110A from the grating 300, then the grating 300 and the beam expander (the prisms 305, 310, 315, 320) are arranged in a Littrow configuration and the wavelength of the light beam 110A reflected from the grating 300 is the Littrow wavelength. It can be assumed that the vertical divergence of the light beam 110A incident onto the grating 300 is near zero. To reflect the nominal wavelength, the grating 300 is aligned, with respect to the light beam 110A incident onto the grating 300, so that the nominal wavelength is reflected back through the beam expander (the prisms 305, 310, 315, 320) to be amplified in the optical source 105. The Littrow wavelength can then be tuned over the entire gain bandwidth of the resonators within optical source 105 by varying the angle of incidence 362 of the light beam 110A onto the grating 300.

Each of the prisms 305, 310, 315, 320 is wide enough along the transverse direction of the light beam 110A so that the light beam 110A is contained within the surface at which it passes. Each prism optically magnifies the light beam 110A on the path toward the grating 300 from the aperture 355, and therefore each prism is successively larger in size from the prism 320 to the prism 305. Thus, the prism 305 is larger than the prism 310, which is larger than the prism 315, and the prism 320 is the smallest prism.

The prism 320 that is the farthest from the grating 300, and is also the smallest in size, is mounted on the actuation system 320A, and specifically to the rotation shaft 322A, which causes the prism 320 to rotate, and such rotation changes the optical magnification of the light beam 110A impinging upon the grating 300 to thereby modify the bandwidth of the light beam 110A output from the apparatus 130. The actuation system 320A is designed as a rapid actuation system 320A because it includes a rotary stepper motor that includes the rotation shaft 322A to which the prism 320 is fixed. The rotation shaft 322A rotates about its shaft axis, which is parallel with the rotation axis of the prism 320. Moreover, because the actuation system 320A includes the rotary stepper motor, it lacks any mechanical memory and also lacks an energy ground state. Each location of the rotation shaft 322A is at the same energy as each of the other locations of the rotation shaft 322A and the rotation shaft 322A lacks a preferred resting location with a low potential energy.

The rotary stepper motor of the system 320A should be fast enough to move the rotation shaft 322A and therefore the prism 320 rapidly (which means, fast enough to enable the adjustment to the spectral feature of the light beam 110A within the required time frame). In some implementations, the rotary stepper motor of the system 320A is configured with an optical rotational encoder to provide feedback regarding the position of the rotation shaft 322A. Moreover, the rotary stepper motor can be controlled with a motor controller that is a high resolution positional controller and uses a variable-frequency drive control method. In one example, the rotary stepper motor of the system 320A is fast enough to move the rotation shaft 322A and the prism 320 15 degrees in less than 50 ms and the accuracy of the optical rotational encoder can be less than 50 microdegrees (for example, 15 degrees in 30 ms). One example of a variable-frequency drive control method is vector motor control, in which stator currents of the motor are controlled by way of two orthogonal components, the magnetic flux of the motor and the torque. The optical rotational encoder can be an encoder with optical scanning that incorporates measuring standards of periodic structures known as graduations that are applied to a carrier substrate of glass or steel. In some examples, the optical rotation encoder is made by HEIDENHAIN.

Figure 4A:
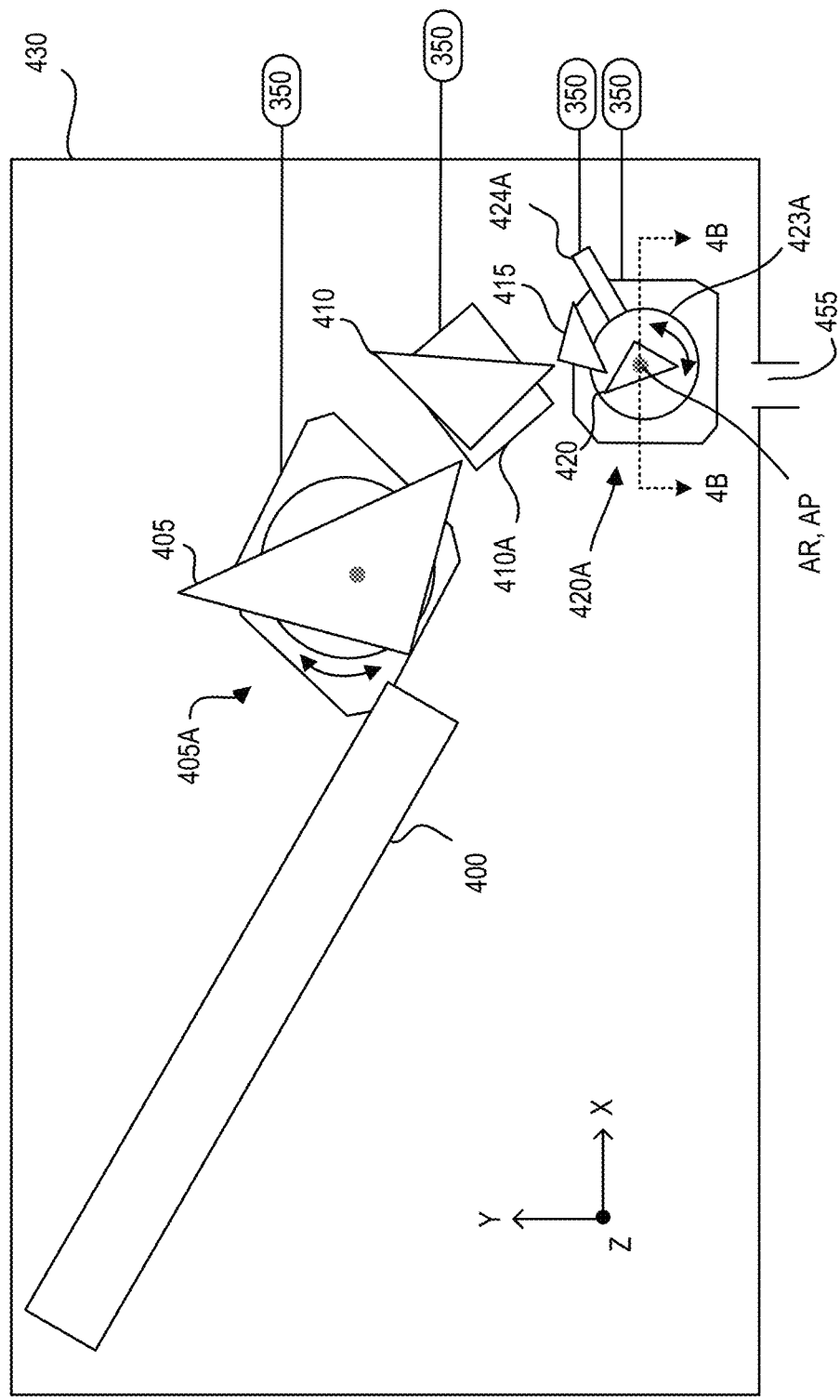
Figure 4B:
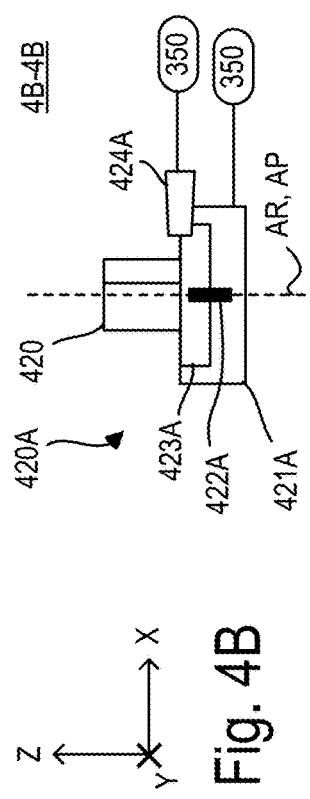
FIG. 4B is a side view of a portion of an exemplary beam expander of the spectral feature selection apparatus of FIG. 4A.

Referring to FIGS. 4A and 4B, in a first implementation, a spectral feature selection apparatus 430 is designed with a grating 400 and four prisms 405, 410, 415, 420. The grating 400 and the four prisms 405, 410, 415, 420 are configured to interact with the light beam 110A produced by the optical source 105 after the light beam 110A passes through an aperture 455 of the apparatus 430. The light beam 110A travels along a path in the XY plane of the apparatus 430 from the aperture 455, through the prism 420, the prism 415, the prism 410, the prism 405, and then is reflected from the grating 400, and back through the prisms 405, 410, 415, 420 before exiting the apparatus through the aperture 455.

The prisms 405, 410, 415, 420 are right-angled prisms through which the pulsed light beam 110A is transmitted so that the pulsed light beam 110A changes its optical magnification as it passes through each right-angled prism. The right-angled prism 420 that is farthest from the dispersive optical element 400 has the smallest hypotenuse of the plurality, and each consecutive right-angled prism closer to the dispersive optical element 400 has a larger or same size hypotenuse than the adjacent right-angled prism that is farther from the dispersive optical element.

For example, the prism 405 that is closest to the grating 400 is also the largest in size, for example, its hypotenuse has the largest extent of the four prisms 405, 410, 415, 420. The prism 420 that is farthest from the grating 400 is also the smallest in size, for example, its hypotenuse has the smallest extent of the four prisms 405, 410, 415, 420. It is possible for adjacent prisms to be the same size. But, each prism that is closer to the grating 400 should be at least as large or greater than in size its adjacent prism because the light beam 110A is optically magnified as travels through the prism 420, the prism 415, the prism 410, and the prism 405, and thus the transverse extent of the light beam 110A enlarges as the light beam 110A gets closer to the grating 400. The transverse extent of the light beam 110A is the extent along the plane that is perpendicular to the propagation direction of the light beam 110A. And, the propagation direction of the light beam 110A is in the XY plane of the apparatus 430.

The prism 405 is physically coupled to an actuation system 405A that rotates the prism 405 about an axis that is parallel with the Z axis of the apparatus 430, the prism 410 is physically coupled to an actuation system 410A that rotates the prism 410 about an axis that is parallel with the Z axis, and the prism 420 is physically coupled to a rapid actuation system 420A. The rapid actuation system 420A is configured to rotate the prism 405 about an axis that is parallel with the Z axis of the apparatus 430.

The rapid actuation system 420A includes a rotary stepper motor 421A that has a rotation shaft 422A and rotation plate 423A fixed to the rotation shaft 422A. The rotation shaft 422A and therefore the rotation plate 423A rotate about a shaft axis AR that is parallel with a center of mass (that corresponds to a rotation axis AP) of the prism 420 and is also parallel with the Z axis of the apparatus 430. Although not necessary, the shaft axis AR of the prism 420 can correspond with or align with the center of mass (the rotation axis AP) of the prism 420 along the XY plane. In some implementations, the center of mass (or rotation axis AP) of the prism 420 is offset from the shaft axis AR along the XY plane. By offsetting the shaft axis AR from the prism 420 center of mass, the position of the light beam 110A can be adjusted to be at a particular position on the surface of the grating 400 whenever the prism 420 is rotated.

By mounting the prism 420 to the rotation plate 423A, the prism 420 is directly rotated about its rotation axis AP as the shaft 422A and rotation plate 423A are rotated about their shaft axis AR. In this way, rapid rotation or control of the prism 420 is enabled when compared with a system that uses a linear stepper motor having a linearly translatable shaft (that is converted into a rotational motion using a flexure). Because a rotational step of the shaft 422A (and plate 423A) directly correlates to a rotational step of the prism 420 (without the imparting any a linear motion), the rotary stepper motor 421A is able to rotate the prism 420 at a speed that enables more rapid adjustment of spectral features (such as the bandwidth) of the light beam 110A and therefore the light beam 110. The rotary design of the stepper motor 421A imparts a purely rotational motion to the prism 420, which is mounted without the use of any linear motion or flexure motion that are found on prior actuators for the prism 420. Moreover, the use of a rotary shaft 422A enables the prism 420 to be rotated about a full 360°, unlike the prior actuator that used a linear stepper motor plus a flexure design (in which the prism 420 could only be rotated about the angle determined from the flexure). In some implementations, in order to achieve a tuning of the bandwidth of the light beam 110A in an acceptable range, the prism 420 is capable of being rotated by 15 degrees. The prism 420 can be rotated by larger than 15 degrees though it is not necessary with the current bandwidth range requirements.

In some implementations, the stepper motor 421A can by a direct drive stepper motor. A direct drive stepper motor is a conventional electromagnetic motor that uses a built-in step motor functionality for position control. In other implementations in which a higher resolution in motion may be needed, the stepper motor 421A can use a piezoelectric motor technology.

The stepper motor 421A can be a rotary stage that is controlled with a motor controller using a variable-frequency drive control method to provide the rapid rotation of the prism 420.

As discussed above, the advantage of using a rotary stepper motor 421A is to obtain more rapid rotation of the prism 420 because the rotation axis AP of the prism 420 is parallel with the rotational shaft 422A and also the shaft axis AR. Thus, for every unit rotation of the shaft 422A, the prism 420 rotates by an incremental unit and the prism 420 rotates as fast as the rotational shaft 422A can rotate. In some implementations, in order to increase the stability of this configuration, and increase the stability of the prism 420, the rapid actuation system 420A includes a position monitor 424A that is configured to detect a position of the rotational shaft 422A of the rotary stepper motor 421A. The error between the measured position of the rotational shaft 422A and the expected or target position of the rotational shaft 422A correlates directly with the error in the position of the prism 420 and thus, this measurement can be used to determine the rotational error of the prism 420 (that is, the difference between actual rotation and commanded rotation) and to correct for this error during operation.

The control module 350 is connected to the position monitor 424A to receive the value of the position of the rotational shaft 422A and the control module 350 is also able to access a stored or current value of the commanded position of the rotational shaft 422A so that the control module 350 can perform the calculation to determine the difference between the measured value of the position and the commanded position of the rotational shaft 422A and also determine how to adjust the rotational shaft 422A to reduce this error. For example, the control module 350 can determine a size of rotation as well as a direction of rotation of the rotational shaft 422A to offset the error. Alternatively, it is possible for the control system 185 to perform this analysis.

The position monitor 424A can be a very high resolution optical rotary encoder that is built integrally with the rotational plate 423A. The optical rotary encoder uses optical sensing technology and on the rotation of an internal code disc that has opaque lines and patterns on it. For example, the plate 423A is rotated (hence the name rotary encoder) in a beam of light such as a light emitting diode and the markings on the plate 423A act as shutters blocking and unblocking the light. An internal photodiode detector senses the alternating light beam and the encoder's electronics convert the pattern into an electrical signal that is then passed on to the control module 350 through the output of the encoder 424A.

In some implementations, the control module 350 can be designed with a rapid internal dedicated controller solely for operating the rotary stepper motor 421A. For example, the rapid internal dedicated controller can receive the high resolution position data from the encoder 424A and can send a signal directly to the rotary stepper motor 421A to adjust the position of the shaft 422A and thereby adjust the position of the prism 420.

Figure 4C:
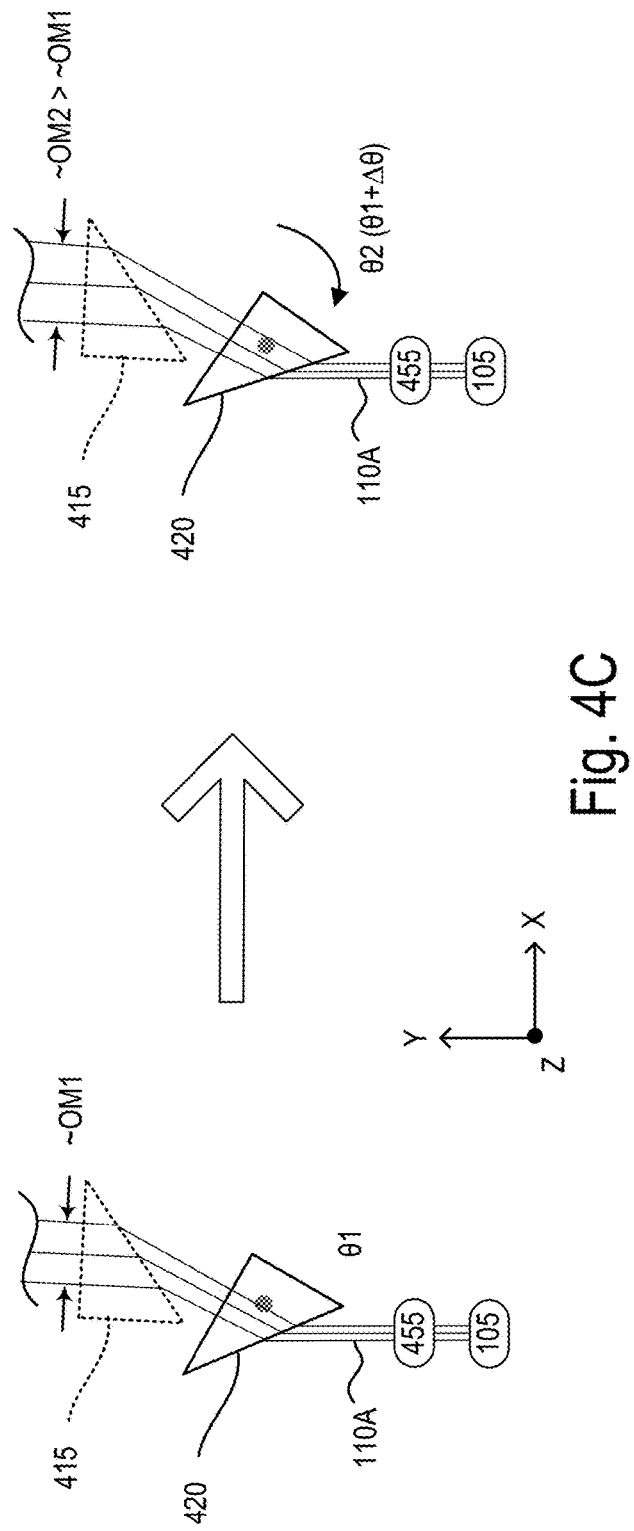
FIG. 4C is a top view of a portion of the exemplary beam expander of FIG. 4B showing an adjustment to the beam expander.

Referring also to FIG. 4C, the illumination system 150 changes a spectral feature such as the bandwidth of the light beam 110A under control of the control system 185, which interfaces with the control module 350. For example, in order to coarsely and broadly control the bandwidth of the light beam 110A and the light beam 110, the control module 350 sends a signal to the rotary stepper motor 421A of the rapid actuation system 420A to rotate the rotational shaft 422A from a first angle θ1 (on the left side of FIG. 4C) to a second angle θ2 (where Δθ=θ2−θ1) (on the right side of FIG. 4C). And, this change of angle of the shaft 422A is directly imparted to the plate 423A, which is fixed to the shaft 422A, and thereby also imparted to the prism 420, which is fixed to the plate 423A. The rotation of the prism 420 from θ1 to θ2 causes a corresponding change in the optical magnification OM 365 of the pulsed light beam 110A that interacts with the grating 400 from OM1 to OM2, and the change in the optical magnification 365 of the pulsed light beam 110A causes a change in the bandwidth of the pulsed light beam 110A (and the light beam 110 as well). The range of the bandwidth that can be achieved by rotating the prism 420 using this rapid actuation system 420A can be a broad range and can be from about 100 femtometers (fm) to about 450 fm. The overall bandwidth range achievable can be at least 250 fm.

The rotation of the prism 420 associated with the rapid actuation system 420A by one unit of rotation of the rotational shaft 422A causes the bandwidth of the pulsed light beam 110A to change by an amount that is less than a resolution of a bandwidth measurement device (for example, as a part of the metrology system 170, which is discussed below) that measures the bandwidth of the pulsed light beam 110. The prism 420 can be rotated by up to 15 degrees to achieve such a change in bandwidth. In practice, the amount of rotation of the prism 420 is constrained only by the optical layout of the other components of the apparatus 430. For example, a rotation that is too large could cause the light beam 110A to be displaced by an amount that is so large that the light beam 110A does not impinge upon the next prism 415. In some implementations, in order to achieve a tuning of the bandwidth of the light beam 110A in an acceptable range, the prism 420 is capable of being rotated by 15 degrees, without risk of the light beam 110A walking off any of the other prisms 405, 410, or 415. The prism 420 can be rotated by larger than 15 degrees though it is not necessary with the current bandwidth range requirements.

Referring again to FIG. 4A, the prism 410 can be mounted to an actuation system 410A that causes the prism 410 to rotate, and such rotation of the prism 410 can provide for fine control of the wavelength of the light beam 110A. The actuation system 410A can include a rotary stepper motor that is controlled with a piezoelectric motor. The piezoelectric motor operates by making use of the converse piezoelectric effect in which a material produces acoustic or ultrasonic vibrations in order to produce a linear or rotary motion.

The next prism 415 that is closer to the grating 400, and has a size that is either larger than or equal to the size of the prism 420, can be fixed in space in some implementations. The next prism 410 that is closer to the grating 400 has a size that is either larger than or equal to the size of the prism 415.

The prism 405 that is closest to the grating 410 has a size that is either larger than or equal to the size of the prism 410 (the prism 405 is the largest prism of the beam expander). The prism 405 can be mounted to an actuation system 405A that causes the prism 405 to rotate and such rotation of the prism 405 can provide for coarse control of the wavelength of the light beam 110A. For example, the prism 405 can be rotated by 1-2 degrees to tune the wavelength of the light beam 110A (and thus the light beam 110) from about 193.2 nanometers (nm) to about 193.5 nm. In some implementations, the actuation system 405A includes a rotary stepper motor that includes a mounting surface (such as the plate 423A) to which the prism 405 is fixed and a motor shaft that rotates the mounting surface. The motor of the actuation system 405A can be a piezoelectric motor that is fifty times faster than a prior linear stepper motor and flexure combination design. Like the actuation system 420A, the actuation system 405A can include an optical rotary encoder that provides angular position feedback for the control system 185 or the control module 350.

Figure 5A:
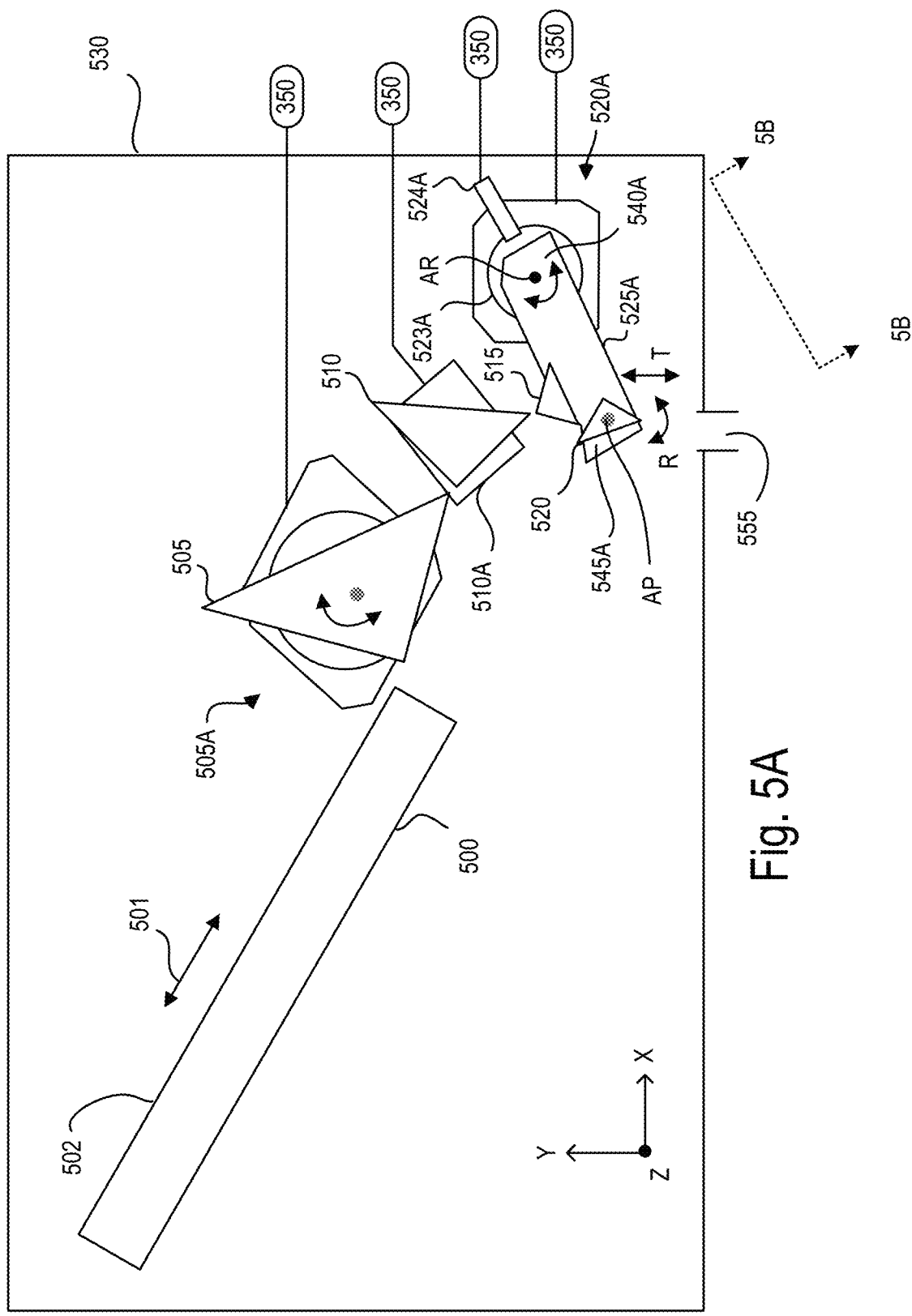
Figure 6A:
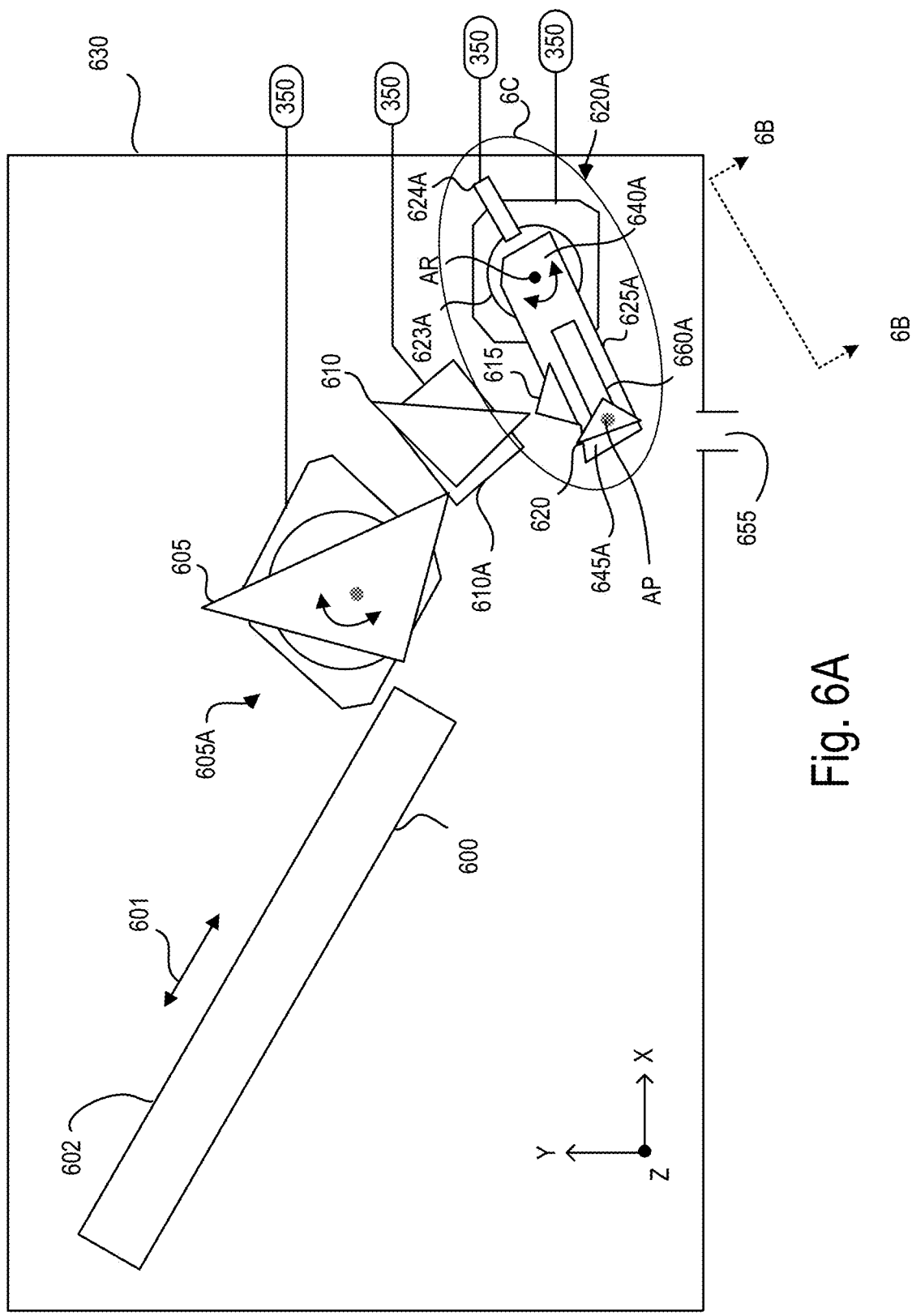

Referring to FIGS. 5A and 5B, in another implementation of the spectral feature selection apparatus 530, a rapid actuation system 520A is designed to rotate R the prism 520 of a beam expander that is farthest from the grating 500 about the shaft axis AR.

The apparatus 530 includes an extending arm 525A that has a first region 540A that is mechanically linked to the rotational plate 523A at the location of the shaft axis AR. The extending arm 525A has a second region 545A that is offset from the shaft axis AR along a direction in the XY plane (and thus along a direction that is perpendicular to the shaft axis AR) so that the second region 545A is not intersected by the shaft axis AR. The prism 520 is mechanically linked to the second region 545A.

Both the center of mass (the prism axis AP) of the prism 520 and the shaft axis AR remain parallel with the Z axis of the apparatus 530; however, the center of mass of the prism 520 is offset from the shaft axis AR. A rotation of the extending arm 525A about the shaft axis AR by an angle $\Delta\theta$ imparts a combined movement to the prism 520: a rotation R of the prism 520 about the shaft axis AR by an angle $\Delta\theta$ (see FIG. 5C) within the XY plane, and a linear translation T to the prism 520 along a direction that lies within the XY plane of the apparatus 530. In the example of FIG. 5C, the prism 520 is rotated R from a first angle $\theta 1$ to a second angle $\theta 2$ and is translated T from a first position Pos1 in the XY plane to a second position Pos2 in the XY plane.

The linear translation T to the prism 520 thereby translates the light beam 110A along a direction that is parallel with the longer axis 501 of the surface 502 of the grating 500. The longer axis 501 also lies along the XY plane of the apparatus 530. By performing this translation of the light beam 110A, it is possible to control which area or region of the grating 500 is illuminated at the lower end of the range of possible optical magnifications OM. Moreover, the grating 500 and the surface 502 of the grating is non-uniform; namely, some regions of the surface 502 of the grating 500 impart a different change to the wavefront of the light beam 110A than other regions of the surface 502 of the grating 500 and some regions of the surface 502 impart more distortion to the wavefront of the light beam 110A than other regions of the surface 502. The control system 185 (or control module 350) can control the rapid actuation system 520A to thereby adjust the linear translation T to the prism 520 and adjust the translation of the light beam 110A along the longer axis 501 to take advantage of the non-uniformity of the grating 500 surface 502 and illuminate a higher distortion region of the grating surface 502 near one end of the grating surface 502 to raise the spectral bandwidth even more than the effect of simply lowering the optical magnification would achieve.

Additionally, the linear translation T to the prism 520 also translates the hypotenuse H (see FIG. 5C) of the prism 520 during rotation of the prism 520 relative to the location of the light beam 110A. The translation to the hypotenuse H therefore exposes new regions of the hypotenuse H to the light beam 110A during operation of the apparatus 530. Over the lifetime of the apparatus 530, the prism 520 is rotated from one end of its rotation range to the other end and also more regions are exposed to the light beam 110A, which reduces the amount of damage imparted to the prism 520 by the light beam 110A.

Similar to the apparatus 430, the spectral feature selection apparatus 530 also includes a grating 500, and the beam expander includes the prisms 505, 510, 515, which are positioned along the path of the light beam 110A between the prism 520 and the grating 500. The grating 500 and the four prisms 505, 510, 515, 520 are configured to interact with the light beam 110A produced by the optical source 105 after the light beam 110A passes through an aperture 555 of the apparatus 530. The light beam 110A travels along a path in the XY plane of the apparatus 530 from the aperture 555, through the prism 520, the prism 515, the prism 510, the prism 505, and then is reflected from the grating 500, and back through the consecutive prisms 505, 510, 515, 520 before exiting the apparatus 530 through the aperture 555.

Referring to FIGS. 6A-6D, in other implementations, a rapid actuation system 620A is designed like the rapid actuation system 520A but with an added secondary actuator 660A. The secondary actuator 660A is physically coupled to the prism 620 that is farthest from the grating 600. The secondary actuator 660A is configured to rotate the prism 620 about an axis AH that lies in the XY plane and also lies in the plane of a hypotenuse H of the prism 620.

In some implementations, although not required the secondary actuator 660A is controlled by the control module 350 (or the control system 185). The secondary actuator 660A can be a manual screw and flexure design that is not controlled by the control module 350 or the control system 185. For example, the actuator 660A could be set before the system 620A is used or periodically can be changed manually in between uses of the system 620A.

The prism 620 can therefore be rotated about the axis AH that lies in the XY plane to enable greater control over where the light beam 110A enters the prism 620 and the hypotenuse H of the prism 620 in order to better maintain the path of the light beam 110A through each of the prisms 615, 610, 605, and the grating 600. Specifically, rotation of the prism 620 about the axis AH enables the light beam 110A to be more finely adjusted. For example, the prism 620 can be rotated about the axis AH to ensure that the retro-reflected (that is, diffracted) light beam 110A from the grating 600 remains in the XY plane and is not displaced along the Z axis of the apparatus 630 even if the prism 620 is rotated about the AP or AR axis. It is beneficial to have this Z axis adjustment if the AP or AR axis is not perfectly aligned with the Z axis. Additionally, it can be beneficial to rotate the prism 620 about the AH axis because the extending arm 625A is a cantilever and it can sag or move in a manner along the Z axis such that it deflects about the axis AH and the secondary actuator 660A can be used to offset this deflection.

Referring to FIG. 7, in another implementation, a spectral feature selection apparatus 730 is designed with a dispersive optical element (such as a grating) 700, and a beam expander that includes three or more refractive optical elements configured to optically magnify the light beam 110A as it travels from the aperture 755 toward the grating 700. The beam expander in this example includes four right-angled prisms 705, 710, 715, 720 through which the pulsed light beam 110A is transmitted so that the pulsed light beam 110A changes its optical magnification as it passes through each right-angled prism, as discussed above. The prism 705 closest to the grating 700 has a hypotenuse 705H that has the largest length of those of the prisms of the beam expander. Each consecutive right-angled prism farther from the grating 700 than the prism 705 has a hypotenuse 710H, 715H, 720H that has a length that is smaller than or equal to the hypotenuse H of the adjacent right-angled prism that is closer to the grating 700.

The right-angled prism 705 that is closest to the grating 700 is arranged with its right angle α positioned away from the grating 700. This can be compared with the prism 405 of the apparatus 430 of FIG. 4A, in which its right angle is positioned toward or next to the grating 400. Moreover, the region 707 between the right-angled prism 705 and the grating 700 is void of any other optical element. There is no optical element (such as a reflective optical element or refractive optical element) between the prism 705 and the grating 700. Thus, the light beam 110A travels between the prism 705 and the grating 700 without passing through any other optical element.

By flipping the prism 705 in this manner from the layout shown in FIG. 4A to the layout shown in FIG. 7, it is possible to obtain a greater change in optical magnification 365 of the light beam 110A for each unit of rotation of the prism 720, and thus enables more rapid adjustment of the bandwidth of the light beam 110A (and the light beam 110). In this implementation, in order to adjust the bandwidth of the light beam 110A, the prisms 720 and 710 are rotated in conjunction with each other to obtain a wide range of optical magnifications. Specifically, when the prism 720 and the prism 710 are rotated in conjunction with each other, the optical magnification can be adjusted from a lower value of 13× to an upper value of 75×, which is a wider range than possible in the layout of FIG. 4A. The layout of the apparatus 730 provides the fastest way in which to adjust the bandwidth of the light beam 110A when the two prisms 720, 710 are rotated in conjunction with each other. The apparatus 730 has an overall different configuration than the apparatus 430 of FIG. 4A and would require a redesign or reconfiguration of the other components (such as the optical source 105) of the illumination system 150.

Figure 8:
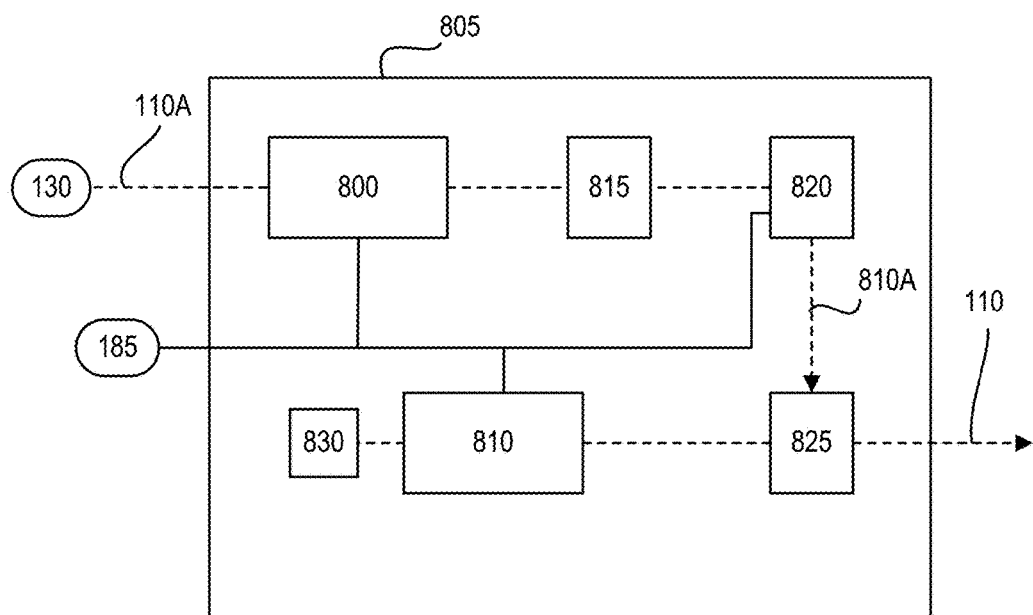
FIG. 8 is a block diagram of an exemplary optical source of the photolithography system of FIG. 1.
Figure 9:
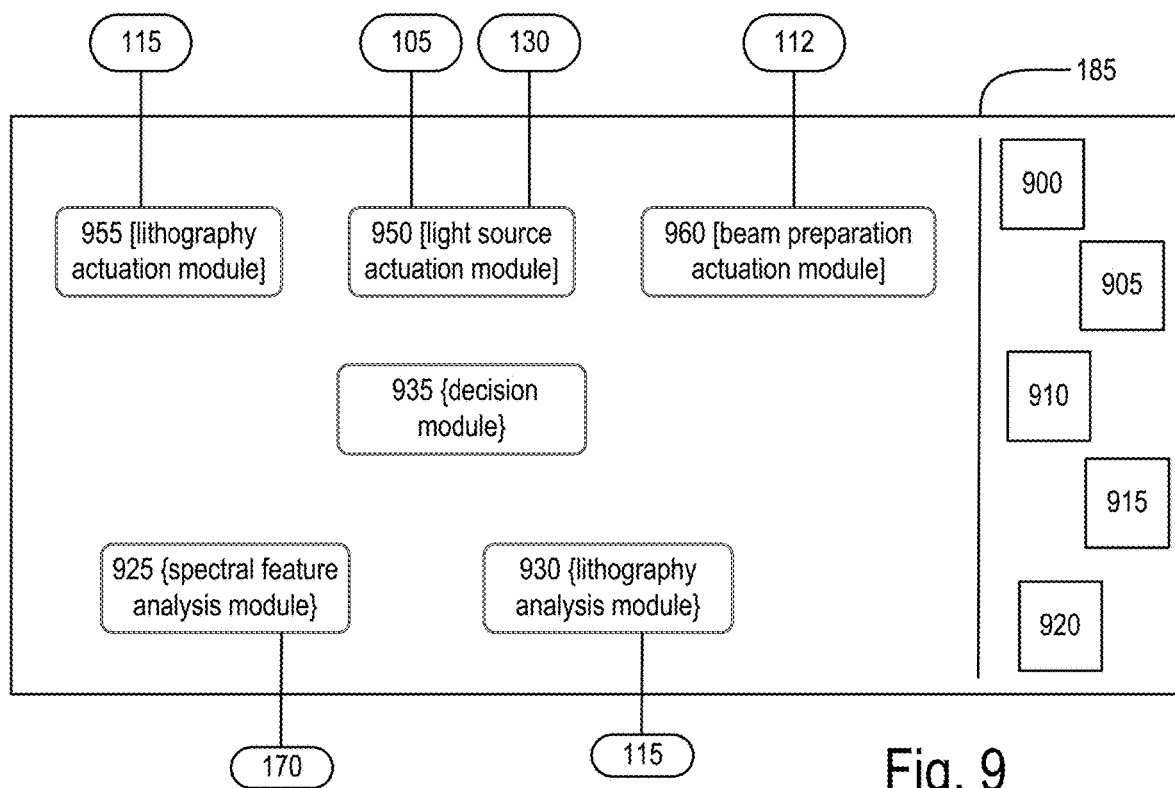
FIG. 9 is a block diagram of an exemplary control system of the photolithography system of FIG. 1.

Next, a discussion about the other aspects of the photolithography system 100 is provided with reference to FIGS. 1, 8, and 9.

As shown in FIG. 1, the control system 185 is operatively connected to the pulsed optical source 105 and to the spectral feature selection apparatus 130. And, the scanner 115 includes a lithography controller 140 operatively connected to the control system 185 and components within the scanner 115.

The pulse repetition rate of the pulsed light beam 110 is the rate at which pulses of the light beam 110 are produced by the optical source 105. Thus, for example, the repetition rate of the pulsed light beam 110 is $1/\Delta t$, where $\Delta t$ is the time between the pulses. The control system 185 is generally configured to control the repetition rate at which the pulsed light beam 110 is produced including modifying the repetition rate of the pulsed light beam as it is exposing the wafer 120 in the scanner 115.

In some implementations, the scanner 115 triggers the optical source 105 (through the communication between the controller 140 and the control system 185) to produce the pulsed light beam 110, so the scanner 115 controls the repetition rate, spectral features such as the bandwidth or wavelength, and/or the dose by way of the controller 140 and the control system 185. For example, the controller 140 sends a signal to the control system 185 to maintain the repetition rate of the light beam 110 within a particular range of acceptable rates. The scanner 115 generally maintains the repetition rate constant for each burst of pulses of the light beam 110. A burst of pulses of the light beam 110 can correspond to an exposure field on the wafer 120. The exposure field is the area of the wafer 120 that is exposed in one scan of an exposure slit or window within the scanner 115. A burst of pulses can include anywhere from 10 to 500 pulses, for example.

The critical dimension (CD) is the smallest feature size that can be printed on the wafer 120 by the system 100. The CD depends on the wavelength of the light beam 110. To maintain a uniform CD of the microelectronic features printed on the wafer 120, and on other wafers exposed by the system 100, the center wavelength of the light beam 110 should remain at an expected or target center wavelength or within a range of wavelengths around the target wavelength. Thus, in addition to maintaining the center wavelength at the target center wavelength or within a range of acceptable wavelengths about the target center wavelength, it is desirable to maintain the bandwidth of the light beam 110 (the range of wavelengths in the light beam 110) to within an acceptable range of bandwidths.

In order to maintain the bandwidth of the light beam 110 to an acceptable range, or to adjust the bandwidth of the light beam 110, the control system 185 is configured to determine an amount of adjustment to the bandwidth of the pulsed light beam 110. Additionally, the control system 185 is configured to send a signal to the spectral feature selection apparatus 130 to move at least one optical component of the apparatus 130 (for example, the prism 320) to thereby change the bandwidth of the pulsed light beam 110 by the determined adjustment amount as the pulsed light beam 110 is exposing the wafer 120 to thereby compensate for the bandwidth variation caused by the modification of the pulse repetition rate of the pulsed light beam 110.

The bandwidth of the pulsed light beam 110 can be changed in between any two bursts of pulses. Moreover, the time that it takes for the bandwidth to be changed from a first value to a second value and also to stabilize at the second value should be less than the time between the bursts of pulses. For example, if the period of time between bursts is 50 milliseconds (ms), then the total time to change the bandwidth from a first value to a second value and stabilize at the second value should be less than 50 ms. The control system 185 and the spectral feature selection apparatus 130 are designed to enable such a rapid change of the bandwidth, as discussed in detail below.

The controller 140 of the scanner 115 sends a signal to the control system 185 to adjust or modify an aspect (such as the bandwidth or the repetition rate) of the pulsed light beam 110 that is being scanned across the wafer 120. The signal sent to the control system 185 can cause the control system 185 to modify an electrical signal sent to the pulsed optical source 105 or an electrical signal sent to the apparatus 130. For example, if the pulsed optical source 105 includes a gas laser amplifier then the electrical signal provides a pulsed current to electrodes within one or more gas discharge chambers of the pulsed optical source 105.

With reference again to FIG. 1, the wafer 120 is placed on a wafer table constructed to hold the wafer 120 and connected to a positioner configured to accurately position the wafer 120 in accordance with certain parameters and under control of the controller 140.

The photolithography system 100 can also include the metrology system 170, which can include a sub-system that measures one or more spectral features (such as the bandwidth or wavelength) of the light beam 110. Because of various disturbances applied to the photolithography system 100 during operation, the value of the spectral feature (such as the bandwidth or the wavelength) of the light beam 110 at the wafer 120 may not correspond to or match with the desired spectral feature (that is, the spectral feature that the scanner 115 expects). Thus, the spectral feature (such as a characteristic bandwidth) of light beam 110 is measured or estimated during operation by estimating a value of a metric from the optical spectrum so that an operator or an automated system (for example, a feedback controller) can use the measured or estimated bandwidth to adjust the properties of the optical source 105 and to adjust the optical spectrum of the light beam 110. The sub-system of the metrology system 170 measures the spectral feature (such as the bandwidth and/or the wavelength) of the light beam 110 based on this optical spectrum.

The metrology system 170 receives a portion of the light beam 110 that is redirected from a beam separation device that is placed in a path between the optical source 105 and the scanner 115. The beam separation device directs a first portion or percentage of the light beam 110 into the metrology system 170 and directs a second portion or percentage of the light beam 110 toward the scanner 115. In some implementations, the majority of the light beam 110 is directed in the second portion toward the scanner 115. For example, the beam separation device directs a fraction (for example, 1-2%) of the light beam 110 into the metrology system 170. The beam separation device can be, for example, a beam splitter.

The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illuminator system adjusts the range of angles for the light beam 110 impinging on the mask. The illuminator system also homogenizes (makes uniform) the intensity distribution of the light beam 110 across the mask.

The scanner 115 can include, among other features, the lithography controller 140, air conditioning devices, and power supplies for various electrical components. In addition to controlling the repetition rate of the pulses of the light beam 110 (discussed above), the lithography controller 140 controls how layers are printed on the wafer 120. The lithography controller 140 includes memory that stores information such as process recipes and also may store information about which repetition rates may be used or are preferable as described more fully below.

The wafer 120 is irradiated by the light beam 110. A process program or recipe determines the length of the exposure on the wafer 120, the mask used, as well as other factors that affect the exposure. During lithography, as discussed above, a plurality of pulses of the light beam 110 illuminates the same area of the wafer 120 to constitute an illumination dose. The number N of pulses of the light beam 110 that illuminate the same area can be referred to as the exposure window or slit and the size of the slit can be controlled by an exposure slit placed before the mask. In some implementations, the value of N is in the tens, for example, from 10-100 pulses. In other implementations, the value of N is greater than 100 pulses, for example, from 100-500 pulses.

One or more of the mask, the objective arrangement, and the wafer 120 can be moved relative to each other during the exposure to scan the exposure window across an exposure field. The exposure field is the area of the wafer 120 that is exposed in one scan of the exposure slit or window.

Referring to FIG. 8, an exemplary optical source 805 is a pulsed laser source that produces a pulsed laser beam as the light beam 110. The optical source 805 is a two-stage laser system that includes a master oscillator (MO) 800 that provides the seed light beam 110A to a power amplifier (PA) 810. The master oscillator 800 typically includes a gain medium in which amplification occurs and an optical feedback mechanism such as an optical resonator. The power amplifier 810 typically includes a gain medium in which amplification occurs when seeded with the seed laser beam from the master oscillator 800. If the power amplifier 810 is designed as a regenerative ring resonator then it is described as a power ring amplifier (PRA) and in this case, enough optical feedback can be provided from the ring design. The spectral feature selection apparatus 130 receives the light beam 110A from the master oscillator 800 to enable fine tuning of spectral parameters such as the center wavelength and the bandwidth of the light beam 110A at relatively low output pulse energies. The power amplifier 810 receives the light beam 110A from the master oscillator 800 and amplifies this output to attain the necessary power for output to use in photolithography.

The master oscillator 800 includes a discharge chamber having two elongated electrodes, a laser gas that serves as the gain medium, and a fan circulating the gas between the electrodes. A laser resonator is formed between the spectral feature selection apparatus 130 on one side of the discharge chamber, and an output coupler 815 on a second side of the discharge chamber to output the seed light beam 110A to the power amplifier 810.

The optical source 805 can also include a line center analysis module (LAM) 820 that receives an output from the output coupler 815, and one or more beam modification optical systems 825 that modify the size and/or shape of the beam as needed. The line center analysis module 820 is an example of one type of measurement system within the metrology system 170 that can be used to measure the wavelength (for example, the center wavelength) of the seed light beam.

The power amplifier 810 includes a power amplifier discharge chamber, and if it is a regenerative ring amplifier, the power amplifier also includes a beam reflector or beam turning device 830 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam 110A is amplified by repeatedly passing through the power amplifier 810. The beam modification optical system 825 provides a way (for example, a partially-reflecting mirror) to in-couple the seed light beam 110A and to out-couple a portion of the amplified radiation from the power amplifier to form the output light beam 110.

The laser gas used in the discharge chambers of the master oscillator 800 and the power amplifier 810 can be any suitable gas for producing a laser beam around the required wavelengths and bandwidth. For example, the laser gas can be argon fluoride (ArF), which emits light at a wavelength of about 193 nm, or krypton fluoride (KrF), which emits light at a wavelength of about 248 nm.

The line center analysis module 820 monitors the wavelength of the output (the light beam 110A) of the master oscillator 800. The line center analysis module 820 can be placed at other locations within the optical source 805, or it can be placed at the output of the optical source 805.

Referring to FIG. 9, details about the control system 185 are provided that relate to the aspects of the system and method described herein. The control system 185 can include other features not shown in FIG. 9. In general, the control system 185 includes one or more of digital electronic circuitry, computer hardware, firmware, and software.

The control system 185 includes memory 900, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control system 185 can also include one or more input devices 905 (such as a keyboard, touch screen, microphone, mouse, hand-held input device, etc.) and one or more output devices 910 (such as a speaker or a monitor).

The control system 185 includes one or more programmable processors 915, and one or more computer program products 920 tangibly embodied in a machine-readable storage device for execution by a programmable processor (such as the processors 915). The one or more programmable processors 915 can each execute a program of instructions to perform desired functions by operating on input data and generating appropriate output. Generally, the processor 915 receives instructions and data from memory 900. Any of the foregoing may be supplemented by, or incorporated in, specially designed ASICs (application-specific integrated circuits).

The control system 185 includes, among other components, a spectral feature analysis module 925, a lithography analysis module 930, a decision module 935, a light source actuation module 950, a lithography actuation module 955, and a beam preparation actuation module 960. Each of these modules can be a set of computer program products executed by one or more processors such as the processors 915. Moreover, any of the modules 925, 930, 935, 950, 955, 960 can access data stored within the memory 900.

The spectral feature analysis module 925 receives the output from the metrology system 170. The lithography analysis module 930 receives information from the lithography controller 140 of the scanner 115. The decision module 935 receives the outputs from the analyses modules (such as the modules 925 and 930) and determines which actuation module or modules need to be activated based on the outputs from the analyses modules. The light source actuation module 950 is connected to one or more of the optical source 105 and the spectral feature selection apparatus 130. The lithography actuation module 955 is connected to the scanner 115, and specifically to the lithography controller 140. The beam preparation actuation module 960 is connected to one or more components of the beam preparation system 112.

While only a few modules are shown in FIG. 9, it is possible for the control system 185 to include other modules. Additionally, although the control system 185 is represented as a box in which all of the components appear to be co-located, it is possible for the control system 185 to be made up of components that are physically remote from each other. For example, the light source actuation module 950 can be physically co-located with the optical source 105 or the spectral feature selection apparatus 130.

In general, the control system 185 receives at least some information about the light beam 110 from the metrology system 170, and the spectral feature analysis module 925 performs an analysis on the information to determine how to adjust one or more spectral features (for example, the bandwidth) of the light beam 110 supplied to the scanner 115. Based on this determination, the control system 185 sends signals to the spectral feature selection apparatus 130 and/or the optical source 105 to control operation of the optical source 105 via the control module 350.

In general, the spectral feature analysis module 925 performs all of the analysis needed to estimate one or more spectral features (for example, the wavelength and/or the bandwidth) of the light beam 110. The output of the spectral feature analysis module 925 is an estimated value of the spectral feature.

The spectral feature analysis module 925 includes a comparison block connected to receive the estimated spectral feature and also connected to receive a spectral feature target value. In general, the comparison block outputs a spectral feature error value that represents a difference between the spectral feature target value and the estimated value. The decision module 935 receives the spectral feature error value and determines how best to effect a correction to the system 100 in order to adjust the spectral feature. Thus, the decision module 935 sends a signal to the light source actuation module 950, which determines how to adjust the spectral feature selection apparatus 130 (or the optical source 105) based on the spectral feature error value. The output of the light source actuation module 950 includes a set of actuator commands that are sent to the spectral feature selection apparatus 130. For example, light source actuation module 950 sends the commands to the control module 350, which is connected to the actuation systems within the apparatus 330.

The control system 185 causes the optical source 105 to operate at a given repetition rate. More specifically, the scanner 115 sends a trigger signal to the optical source 105 for every pulse (that is, on a pulse-to-pulse basis) and the time interval between those trigger signals can be arbitrary, but when the scanner 115 sends trigger signals at regular intervals then the rate of those signals is a repetition rate. The repetition rate can be a rate requested by the scanner 115.

The repetition rate of the pulses produced by the power amplifier 810 is determined by the repetition rate at which the master oscillator 800 is controlled by the control system 185, under the instructions from the controller 140 in the scanner 115. The repetition rate of the pulses output from the power amplifier 810 is the repetition rate seen by the scanner 115.

The prism 320 (or prism 420, 520, 620, 720) can be used for coarse, large range, slow bandwidth control. By contrast, the bandwidth can be controlled in a fine and narrow range and even more rapidly by controlling a differential timing between the activation of the electrodes within the MO 800 and the PRA 810.

Other implementations are within the scope of the following claims.

For example, in other implementations, the prism 315 is mounted to its own actuation system 315A that causes the prism 315 to rotate, and such rotation changes the angle of incidence of the light beam 110A impinging upon the grating 300 and can be used to provide for fine control of the wavelength of the light beam 110A. The actuation system 315A can include a piezoelectric rotation stage as an actuator. In these other implementations, the prism 310 can be mounted to an actuation system 310A that provides for fine control of the bandwidth of the light beam 110A. Such an actuation system 310A can include as an actuator a stepper motor rotary stage.

What is claimed is:

1. A spectral feature selection apparatus for an optical source that produces a light beam, the apparatus comprising:
    a reflective optical element arranged to interact with a pulsed light beam; and
    a plurality of right-angled prisms through which the pulsed light beam is transmitted so that the pulsed light beam changes its magnification as it passes through each right-angled prism, wherein:
        the pulsed light beam travels along a beam path and has a transverse extent that crosses the hypotenuse of each right-angled prism so that the transverse extent of the pulsed light beam is contained within each of the hypotenuses of each right-angled prism,
        the right-angled prism that is closest to the reflective optical element has a hypotenuse having the largest length of the set,
        each consecutive right-angled prism farther from the reflective optical element has a hypotenuse having a length that is smaller than or equal to the hypotenuse of the adjacent right-angled prism that is closer to the reflective optical element,
        the right-angled prism that is closest to the reflective optical element is arranged with its right angle positioned away from the reflective optical element, and
        the optical path between the right-angled prism that is closest to the reflective optical element and the reflective optical element is void of any other optical element.

2. The apparatus of claim 1, wherein the right-angled prism that is farthest from the reflective optical element is associated with an actuation system and is movable, and the right-angled prism that is the second closest to the reflective optical element is associated with an actuation system and is movable.

3. The apparatus of claim 1, wherein the region between the right-angled prism that is farthest from the reflective optical element and the reflective optical element is void of any other reflective optical element.

4. The apparatus of claim 1, further comprising at least two actuation systems, each actuation system associated with a right-angled prism of the plurality of right-angled prisms and configured to rotate the associated right-angled prism relative to the pulsed light beam to thereby adjust a spectral feature of the pulsed light beam.

5. The apparatus of claim 4, further comprising a control system connected to the at least two actuation systems and configured to send a signal to each actuation system.

6. The apparatus of claim 5, wherein the control system is in communication with a photolithography exposure apparatus that receives the pulsed light beam and the control system is configured to receive an instruction from the photolithography exposure apparatus to thereby modify a spectral feature of the pulsed light beam while sending a signal to the pulsed optical source to produce the pulsed light beam.

7. The apparatus of claim 1, wherein the reflective optical element is a diffractive optical element arranged to interact with a pulsed light beam in a Littrow configuration such that the pulsed light beam diffracted from the diffractive optical element travels along the path of the pulsed light beam that is incident on the diffractive optical element.

8. The apparatus of claim 1, wherein the reflective optical element and the plurality of right-angled prisms are arranged in an XY plane of the apparatus such that the beam path of a pulsed light beam lies in the XY plane.

9. The apparatus of claim 8, wherein at least two of the right-angled prisms are rotatable about a Z direction that is perpendicular to the XY plane.

10. The apparatus of claim 1, wherein the plurality of right-angled prisms includes at least four right-angled prisms.

11. The apparatus of claim 1, further comprising an actuation system associated with the right-angled prism that is farthest from the reflective optical element, the actuation system comprising a rapid actuator comprising a rotary motor having a rotational shaft that rotates about a shaft axis that is perpendicular to an XY plane defined by the reflective optical element and the plurality of right-angled prisms.

12. The apparatus of claim 11, wherein the right-angled prism associated with the rapid actuator is mounted to the rapid actuator such that the associated right-angled prism is rotated about an offset axis that is parallel with and offset from the shaft axis and is offset from the center of gravity of the associated right-angled prism.

13. The apparatus of claim 12, wherein the rapid actuator is configured to cause the associated right-angled prism to rotate about the offset axis and linearly translate.

14. The apparatus of claim 12, wherein the rapid actuator comprises:
    a lever arm comprising:
        a first region that is mechanically linked to the rotational shaft at a location of the shaft axis, and
        a second region that is offset from the shaft axis along a direction perpendicular to the shaft axis and lying in the plane of the apparatus so that the second region is not intersected by the shaft axis;
    wherein the associated right-angled prism is mechanically linked to the second region.

15. The apparatus of claim 1, wherein the reflective optical element is a dispersive optical element arranged to interact with a pulsed light beam such that the pulsed light beam dispersed from the dispersive optical element travels along the path of the pulsed light beam that is incident on the dispersive optical element.

16. A spectral feature selection apparatus for an optical source that produces a light beam, the apparatus comprising:
    a diffractive optical element arranged to interact with a pulsed light beam in a Littrow configuration;
    a set of four or more right-angled prisms through which the pulsed light beam is transmitted so that the pulsed light beam changes its magnification as it passes through each right-angled prism, wherein:
        the pulsed light beam travels along a beam path and has a transverse extent that crosses the hypotenuse of each right-angled prism so that the transverse extent of the pulsed light beam is contained within each of the hypotenuses of each right-angled prism, the right-angled prism that is closest to the diffractive optical element has a hypotenuse having the largest length of the set, each consecutive right-angled prism farther from the diffractive optical element has a hypotenuse having a length that is smaller than or equal to the hypotenuse of the adjacent right-angled prism that is closer to the diffractive optical element, the right-angled prism that is closest to the diffractive optical element is arranged with its right angle positioned away from the diffractive optical element, and the region between the right-angled prism that is farthest from the diffractive optical element and the diffractive optical element is void of any reflective optical element; and at least two actuation systems, each actuation system associated with a right-angled prism of the set and configured to rotate the associated right-angled prism relative to the pulsed light beam to thereby adjust a spectral feature of the pulsed light beam.

17. The apparatus of claim 16, wherein the right-angled prism that is farthest from the diffractive optical element is associated with an actuation system and is movable, and the right-angled prism that is the second closest to the diffractive optical element is associated with an actuation system and is movable.

* * * * *